(12) United States Patent
Gopal

(10) Patent No.: US 11,483,009 B2
(45) Date of Patent: Oct. 25, 2022

(54) SELF-CHECKING COMPRESSION

(71) Applicant: Intel Corporation, Santa Clara, CA (US)

(72) Inventor: Vinodh Gopal, Westborough, MA (US)

(73) Assignee: Intel Corporation, Santa Clara, CA (US)

( * ) Notice: Subject to any disclaimer, the term of this patent is extended or adjusted under 35 U.S.C. 154(b) by 650 days.

(21) Appl. No.: 16/407,105

(22) Filed: May 8, 2019

(65) Prior Publication Data

US 2019/0268017 A1 Aug. 29, 2019

(51) Int. Cl.
*H03M 7/30* (2006.01)
*H03M 7/40* (2006.01)
*H04L 1/00* (2006.01)

(52) U.S. Cl.
CPC ....... *H03M 7/3086* (2013.01); *H03M 7/3084* (2013.01); *H03M 7/40* (2013.01); *H03M 7/4037* (2013.01); *H03M 7/6041* (2013.01); *H04L 1/0057* (2013.01)

(58) Field of Classification Search
CPC .... H03M 7/3086; H03M 7/3084; H03M 7/40; H03M 7/4037; H03M 7/6041
USPC ...................................................... 341/50–90
See application file for complete search history.

(56) References Cited

U.S. PATENT DOCUMENTS

| | | | | |
|---|---|---|---|---|
| 5,822,458 | A * | 10/1998 | Silverstein | H04N 19/85 382/233 |
| 8,276,035 | B1 * | 9/2012 | Savarese | H04L 1/188 714/749 |
| 9,673,836 | B1 * | 6/2017 | Duale | H03M 7/6082 |
| 10,044,369 | B1 * | 8/2018 | Paris | H03M 7/40 |
| 10,044,370 | B1 * | 8/2018 | Pasha. B. K. | H03M 7/6058 |
| 10,103,747 | B1 * | 10/2018 | Pasha.B.K. | H03M 7/6058 |
| 10,333,548 | B1 * | 6/2019 | Sofia | H03M 7/6011 |
| 10,454,498 | B1 * | 10/2019 | Mao | H03M 7/6023 |
| 2005/0229074 | A1 * | 10/2005 | Chawla | H04L 12/1868 714/758 |
| 2006/0262810 | A1 * | 11/2006 | Vadakital | H04N 19/89 370/473 |

(Continued)

*Primary Examiner* — Lam T Mai
(74) *Attorney, Agent, or Firm* — Compass IP Law PC

(57) ABSTRACT

Methods, apparatus, systems, and software for implementing self-checking compression. A byte stream is encoded to generate tokens and selected tokens are encoded with hidden parity information in a compressed byte stream that may be stored for later streaming or streamed to a receiver. As the compressed byte stream is received, it is decompressed, with the hidden parity information being decoded and used to detect for errors in the decompressed data, enabling errors to be detected on-the-fly rather than waiting to perform a checksum over an entire received file. In one embodiment the byte stream is encoded using a Lempel-Ziv 77 (LZ77)-based encoding process to generate a sequence of tokens including literals and references, with all or selected references encoded with hidden parity information in a compressed byte stream having a standard format such as DEFLATE or Zstandard. The hidden parity information is encoded such that the compressed byte stream may be decompressed without parity checks using standard DEFLATE or Zstandard decompression schemes. Dictionary coders such as LZ78 and LZW may also be used.

30 Claims, 20 Drawing Sheets

(56) References Cited

U.S. PATENT DOCUMENTS

| | | | |
|---|---|---|---|
| 2009/0217124 A1* | 8/2009 | Litsyn | H03M 13/1545 |
| | | | 714/752 |
| 2017/0104499 A1* | 4/2017 | Yuan | H03M 13/2909 |
| 2019/0041842 A1* | 2/2019 | Celia | G05B 23/0289 |
| 2019/0042354 A1* | 2/2019 | Coquerel | G06F 3/0656 |
| 2019/0312588 A1* | 10/2019 | Sofia | H03M 7/6011 |
| 2019/0312589 A1* | 10/2019 | Marlow | H03M 7/4081 |
| 2021/0288662 A1* | 9/2021 | Fukazawa | H03M 7/40 |
| 2021/0351790 A1* | 11/2021 | Guilford | H03M 7/30 |

* cited by examiner

```
        q = -q;
    }
    fprintf(stream, "%d.%02d%%", q / 100, q % 100);
} version()
{
    fprintf(stderr, "%s\n", rcs_ident);
    fprintf(stderr, "Options: ");
    #ifdef vax
```

|    | Character | Match-baseline | Match-Parity (Cumulative to Pos) |
|----|-----------|----------------|----------------------------------|
| 1  | q         |                |                                  |
| 2  |           | R (Len=6, d=163) | R (Len=5, d=163)               |
| 3  | /         | R              | R                                |
| 4  |           | R              | R                                |
| 5  | 1         | R              | R                                |
| 6  | 0         | R              | R                                |
| 7  | 0         | R              | R (Len=3, d=6621)                |
| 8  | ,         | R (Len=4, d=9) | R                                |
| 9  |           | R              | R                                |
| 10 | q         | R              |                                  |
| 11 |           | R              | R (Len=3, d=4289)                |
| 12 | %         |                | R                                |
| 13 |           | R (Len=4, d=9) | R                                |
| 14 | 1         | R              | R (Len=3, d=172)                 |
| 15 | 0         | R              | R                                |
| 16 | 0         | R              | R                                |
| 17 | )         | R (Len=4, d=2200) | R (Len=4, d=2200)             |
| 18 | ;         | R              | R                                |
| 19 | \n        | R              | R                                |
| 20 | }         | R              | R                                |

SELF-CHECKING COMPRESSION

BACKGROUND INFORMATION

The amount of data that is transferred via the Internet is staggering. Recent estimates project that there will soon be more than one trillion web pages, and that more than half of the world's population has access to the Internet. At the same time, the capacity of commodity storage devices continues to increase while maintaining or even reducing their cost. For example, 4 Terabyte (TB) magnetic disc drives can be purchased for under $75 and Solid State Drives (SSD) are approaching $100 per Terabyte. There has also been an explosion in cloud-hosted storage services, such as DropBox, Microsoft OneDrive, Google Drive, Box, etc. Meanwhile, because of the cheap cost of storage, there is often little motivation to implement space-efficient storage schemes for most types of data.

This creates a dichotomy. On the one hand, you have an ever-increasing number of users with ever increasing access to storage. On the other hand, the increase in the number of users and their increased appetites for downloaded content results in bandwidth capacities that are constantly being pushed to their limits, leading Internet Service Providers to propose implementing tiered services, while users argue for "Net Neutrality." This problem is even more exacerbated for wireless access, as evidenced by more mobile carriers removing their limitless data plans in favor of tiered data plans or having "unlimited" plans that use throttling.

Data content is transferred over the Internet in one of several packet-based transmission schemes, such as TCP/IP and UDP. This technique is commonly referred to as "streaming," but in reality, the process involves partitioning a stream of bits (e.g., bitstream) comprising or otherwise derived from an original document, into a multitude of packets that are individually sent across the Internet (and/or other networks) and assembled and processed at the receiver to extract the same stream of bits. Furthermore, the processing may involve compression operations at the sender and decompression operations at the receiver. Upon successful completion of the processing, a copy of the original document is obtained.

In order to squeeze the most out of available transfer bandwidth, data content is often streamed in a compressed form. Some types of content are commonly stored in compressed formats based on well-established standards, such as music and video content. Other content, including HTML and general document content are generally not stored in compressed form. For example, the more recent versions of Microsoft Office products store document content in an XML-based format, and it is common to access and stored PDF (portable document format) documents using the Internet and other networks.

One technique for enhancing bandwidth is to perform on-the-fly compression at a sending entity and corresponding decompression at a receiving entity. Similar techniques may be used for real-time or batch archival purposes. In the case of document compression or archival, a "lossless" compression scheme is typically used such that no data is lost when the compressed document content is decompressed. There are various lossless compression techniques employed for such purposes, including entropy encoding schemes such as Huffman coding, run-length encoding, and dictionary coders such as Lempel-Ziv (e.g., LZ77) and Lempel-Ziv-Welch (LZW).

One commonly used compression/decompression scheme is called DEFLATE, which is a variation on LZ that is uses a combination of the LZ77 coding scheme and Huffman coding and is optimized for decompression speed and compression ratio. DEFLATE is used by popular compression tools such as PKZIP, which archives data in the ZIP format. DEFLATE is also used by gzip compressed files and for PNG (Portable Network Graphics) images. In accordance with the use of HTTP Compression defined by RFC 2616, a web server may send and respond to HTTP content that is compressed with gzip compression and decompressed using DEFLATE.

Current compression schemes are generally defined as a raw compressed bit-stream format whose sole purpose is to efficiently encode the data compactly. Higher-level "framing" schemes are then defined to encapsulate the raw compressed stream, and contain information about the enclosed data such as compressed/uncompressed sizes and most importantly, a checksum of the original data for integrity checking. The checksum is usually a 32-bit or 64-bit checksum.

There are several issues with the current definitions. These include,

1. A single checksum that is defined over the entire stream, e.g., in the gzip file trailer.
2. The checksum is defined with a fixed width in terms of bits, for the smallest files to the largest files.
3. A checksum mismatch during decompression can only be detected at the very end, and gives no information about where in the file errors may have occurred.
4. For large files, applications need to buffer a huge amount of data while decompressing, until they can determine whether the recovered data is good (via the checksum).
5. In some cases, applications use the raw format with disastrous consequences if the bit stream gets corrupted, leading to silent data corruption.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIG. 6a is a diagram illustrating encoding the character string of FIG. 4 using the augmented LZ77 parity-encoding scheme of FIG. 5a;

FIG. 14b is a rear isometric view of the blade server chassis of FIG. 14a;

DETAILED DESCRIPTION

Figure 1:
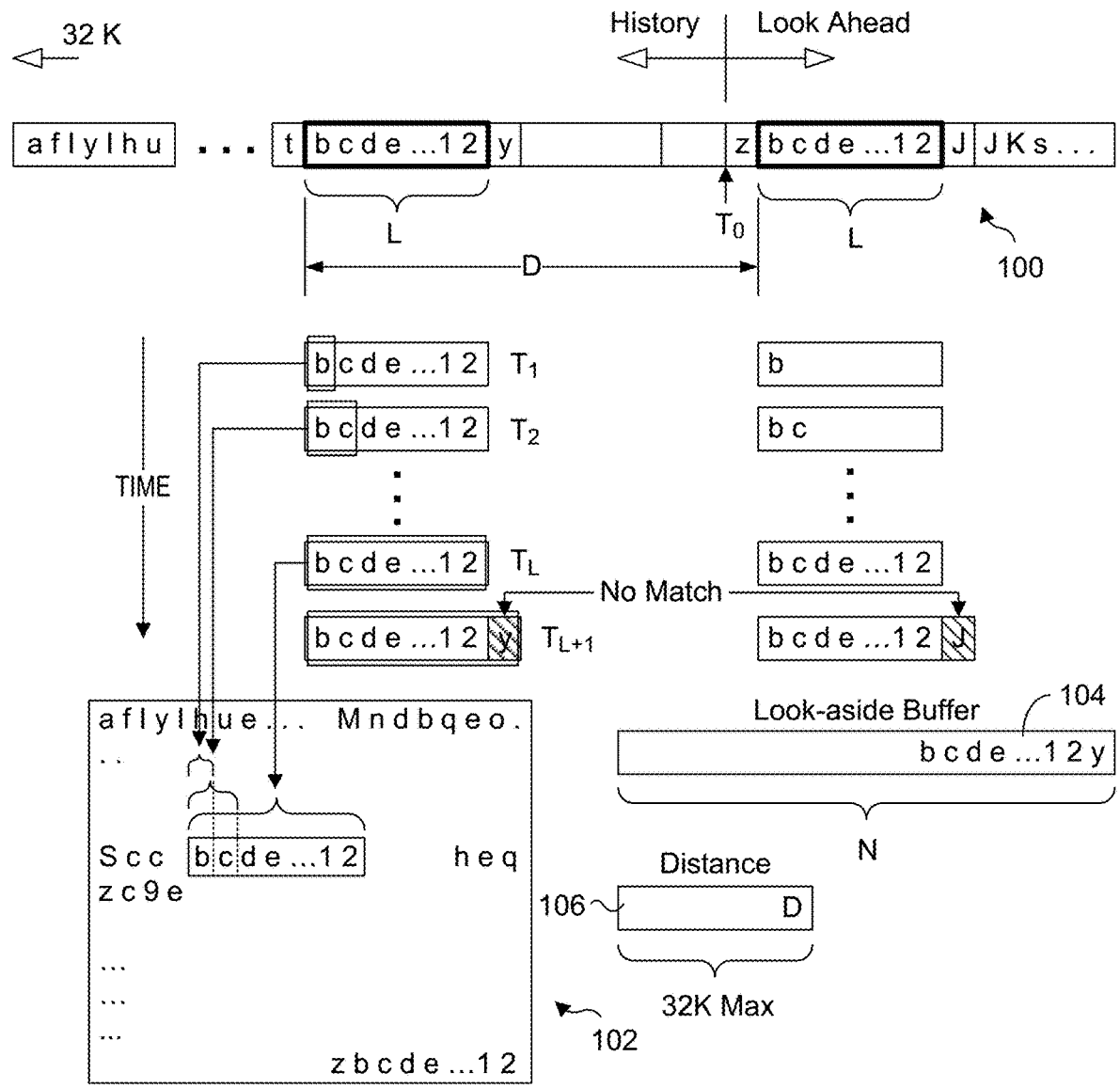
FIG. 1 is a schematic diagram illustrating a sliding window-based string match search scheme.

Embodiments of methods, apparatus, systems, and software for implementing self-checking compression are described herein. In the following description, numerous specific details are set forth (such as embodiments implementing DEFLATE) to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

For clarity, individual components in the Figures herein may also be referred to by their labels in the Figures, rather than by a particular reference number. Additionally, reference numbers referring to a particular type of component (as opposed to a particular component) may be shown with a reference number followed by "(typ)" meaning "typical." It will be understood that the configuration of these components will be typical of similar components that may exist but are not shown in the drawing Figures for simplicity and clarity or otherwise similar components that are not labeled with separate reference numbers. Conversely, "(typ)" is not to be construed as meaning the component, element, etc. is typically used for its disclosed function, implement, purpose, etc.

In accordance with aspects of the embodiments disclosed herein, novel compression and decompression schemes are provided that supports error-checking using standards-compliant compression formats and without relying on any higher-level framing layer for data integrity. Under the embodiments the decompressor can continuously determine whether the uncompressed data is good with increasing confidence. This enables errors to be detected as the streamed compressed data is being received and decompressed without having to wait until the entirety of the content has been received to detect an error, such as is currently done.

LZ77 Compression and Decompression

LZ77 compression schemes find repeated substrings and replace them with backward references (relative distance offsets in the original stream). The compressed data consists of a series of elements of two types: literal bytes and pointers to replicated strings, where a pointer is represented as a pair <length, backward distance offset in the uncompressed stream>. Entropy encoding (e.g. Huffman coding) utilizes variable length codes to represent symbols such that frequent symbols get short codes and infrequent symbols get long codes, thereby representing the set of symbols compactly.

In some exemplary embodiment illustrated herein, the novel error-checking scheme is implemented with compression and decompression using the DEFLATE scheme. However, this is not meant to be limiting, as the technique can generally be applied to other compression/decompression schemes in a similar manner, such as but not limited to LZ4 and ZStandard. The DEFLATE scheme uses a combination of LZ77 compression and Huffman encoding (entropy encoding) to encode a bitstream comprising a sequence of blocks. Each block is preceded by a 3-bit header that identifies whether or not the block is the last block in the stream and the type of encoding method used for the block. Many or most blocks will end being encoded using dynamic Huffman encoding, while other blocks may store a literal or string between 0 and 65,535 bytes in length. Static Huffman encoding may also be used for some blocks.

Compression is achieved through two operations. In the first operation comprises string matching and replacement of duplicate strings with pointers. The second operation comprises replacing symbols with new, weighted symbols based on frequency of use. Within compressed blocks, if a duplicate series of bytes (a repeated string) is detected, then a back-reference is inserted (referred to herein as a reference), linking to the previous location of that identical string instead. An encoded match to an earlier string consists of a length L (or Len) (3-258 bytes) and a distance D (1-32,768 bytes (32 KB)). Relative back-references can be made across any number of blocks, as long as the distance appears within the last 32 KB of uncompressed data decoded, which is referred to as the sliding window. Under another variant, a 64 KB window is used.

In some embodiment, the various operations performed during DEFLATE compression and decompression are based on corresponding coding schemes implemented via software. The coding schemes are well-known, and there are numerous software implementations written in various languages. C programs typically use the zlib library. Similarly, Java includes support as part of the standard library (in java.util.zip).

In addition to implementation using software, the embodiments disclosed here may be implemented in hardware using an embedded processor executing firmware, programmable logic, or a combination of the two. For instance, in some embodiments a DEFLATE compressor and/or decompressor may be implemented in an accelerator, as described below with reference to FIGS. 14 and 16.

FIG. 1 illustrates an example of a finding a match of length L in accordance with a sliding window match scheme. As bytes in a byte stream 100 are received, a match detection scheme employing a sliding window is employed to determine whether there is an identical byte pattern that has been previously received and processed. The process stage shown in FIG. 1 corresponds to a state at which a prior portion of byte stream 100 has be received and processed, as illustrated by the History arrow and data in a lookup cache 102 in which the sliding window portion of the byte stream is temporally stored. Accordingly, once the lookup cache 102 is filled to the 32 KB limit, the content of lookup cache 102 incrementally changes with each cycle, removing the oldest character and adding the last character in byte stream 100 that was processed. For illustrative purposes, byte stream 100 is depicted as a stream of alphanumeric characters, rather than individual bits, which would be how the data would be encoded in an actual byte stream. Also, for illustrative purposes, it is presumed that the alphanumeric characters are encoded as ASCII characters, such that each character is represented by 8 bits, or a single byte, thus the terminology "byte stream." Other 8-bit encodings could also be employed.

The arrow depicting time $T_0$ corresponds to the start of a processing cycle in which a byte corresponding to a character 'z' is evaluated for a match. From a conceptual view, a pattern match operation is performed evaluating character 'z' against previously received characters (bitmap patterns) in byte stream 100. In the case of DEFLATE, the size of the lookup cache is limited up to the previous 32K bytes of bitstream content. To evaluate the 'z' for a match, lookup cache 102 will be searched for a match (which in this case would be a single individual character 'z' that may have been previously received). In this particular example, a prior character 'z' has not been received such that there is no match. According, a literal 'z' will be forwarded for further processing, such as to an entropy coder.

Next, at a time $T_1$, a character 'b' is encountered. At time $T_1$ a search for character 'b' is commenced. In this case a prior 'b' has been received (within the 32 KB sliding window), and thus there is a match. In response to a match, further searching will be performed by adding one additional character (in byte stream 100) at a time to create incrementally longer search strings with evaluation continuing until a string match is not found. During a processing cycle beginning at time $T_2$, a second character 'c' is added to 'b' to create a search string 'b c', which is searched for in lookup cache 102. In one embodiment, a hashing scheme is implemented to facilitate string match searching, such as the hashing scheme defined for DEFLATE in RFC 1951. As before, a match is found, and the process is repeated again multiple times until we reach a cycle corresponding to time $T_L$. At this point, the search string 'b c d e . . . 1 2' is searched for a match. Since this same string has been previously retrieved, a match is found.

In conjunction with the foregoing string search evaluation sequence, for every added character to the string search window the corresponding character is added to a look-aside buffer 104 such that the string in the look-aside buffer at a given point in time matches the current search string window. Also, for each match result, data in a distance register 106 is updated to indicating the distance in bytes to the nearest match.

At a time $T_L+1$ a character 'J' is encountered, such that the match string is now 'b c d e . . . 1 2 J'. Meanwhile the next character in the prior match string is 'y' (and it is presumed that no other strings 'b c d e . . . 1 2 J' where previously received within the 32K sliding window. As a result, there is a miss. At this point, data indicating the length of the longest matched string in look-aside buffer 104 corresponding to the prior match (which can be obtained by removing the last added character) and data in the distance register 106 identifying the distance to the matched string is encoded as a token comprising a <len, distance> pair.

Figure 2:
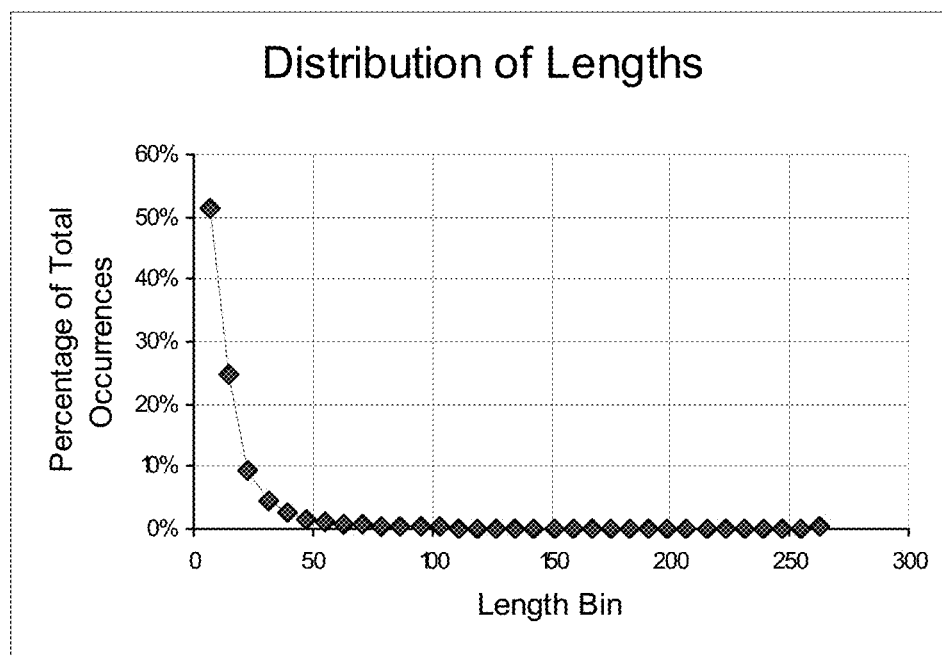
FIG. 2 is a graph depicted a distribution of matched string lengths vs. percentage of occurrences.

Under DEFLATE there can be a matching string length of up to 258 bytes. Under a conventional approach, a hardware look-aside buffer of at least 258 bytes would be used to ensure that any match of 258 bytes or less (that is, any legal DEFLATE string match) could be buffered. However, the frequency of encountering a string match of 258 bytes or more is extremely small. Moreover, the frequency of finding string matches based on length can be approximated as an inverse exponential equation under which the frequency falls off rapidly as the bit length increases. For example, the graph 200 in FIG. 2 is illustrative of the distribution of matching lengths as a percentage of occurrences one might find for a large corpus of files obtained, for example, from the top 500 web sites.

Figure 3:
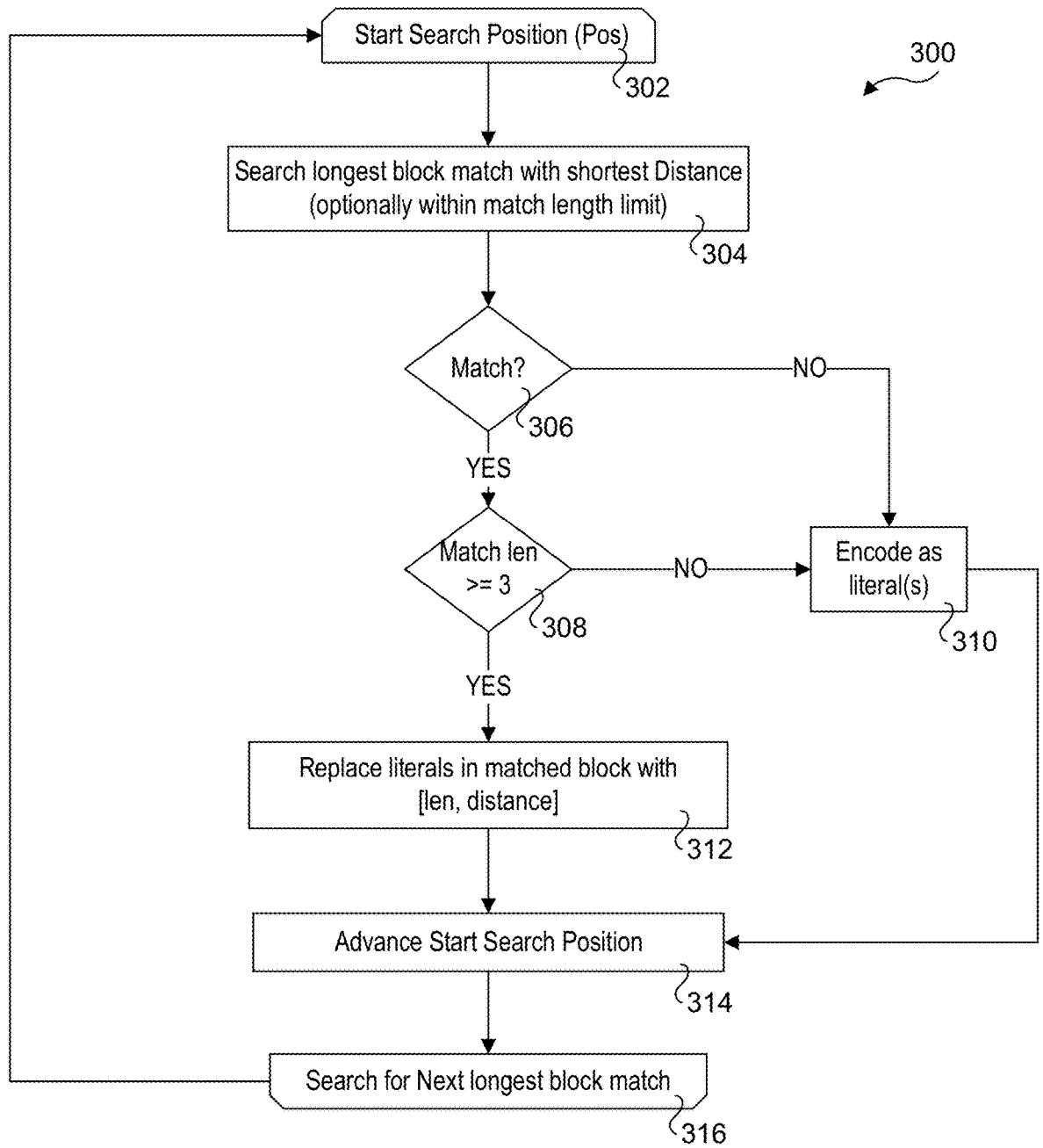
FIG. 3 is a flowchart illustrating operations and logic employed by a conventional LZ77 encoder.

FIG. 3 shows a flowchart 300 illustrating operations and logic performed by a conventional implementation of the LZ77 compression scheme. As shown by start and end loop blocks 302 and 316, the operations are performed in a loop-wise manner until processing of the file (or whatever content is being encoded) is complete.

The loop begins with start loop block 302, which corresponds to the start of the search position (the position at which the next search process begins, referred to herein as 'Pos'). In a block 304 a search for the longest block match with shortest distance is performed, optionally including a match length limit (e.g., the length of the longest match is limited). Details of this process are described above with reference to FIG. 1 and are well-known. As depicted by decision block 306 and 308, if there is no match or if the longest match has a length that is less than 3, the logic proceeds to a block 310 in which the byte values are encoded as literals, and then to a block 314 where the start search position Pos is advanced by the number of literals that are encoded. The logic then proceeds to end loop block 316, which returns the processing to start loop block 302 to begin searching for the next longest match block in block 304.

If the result of the longest block match returns a block with a length of greater or equal to 3, the answer to decision block 308 will be YES, and the logic will proceed to replace the literals in the matched block with [len, distance], where len is the length of the match block and distance is the shortest distance to a previous block that is matched. As before, the start search position is advanced in block 314 (this time by len), and the logic loops back from end loop block 316 to start loop block to repeat the process.

Figure 4:
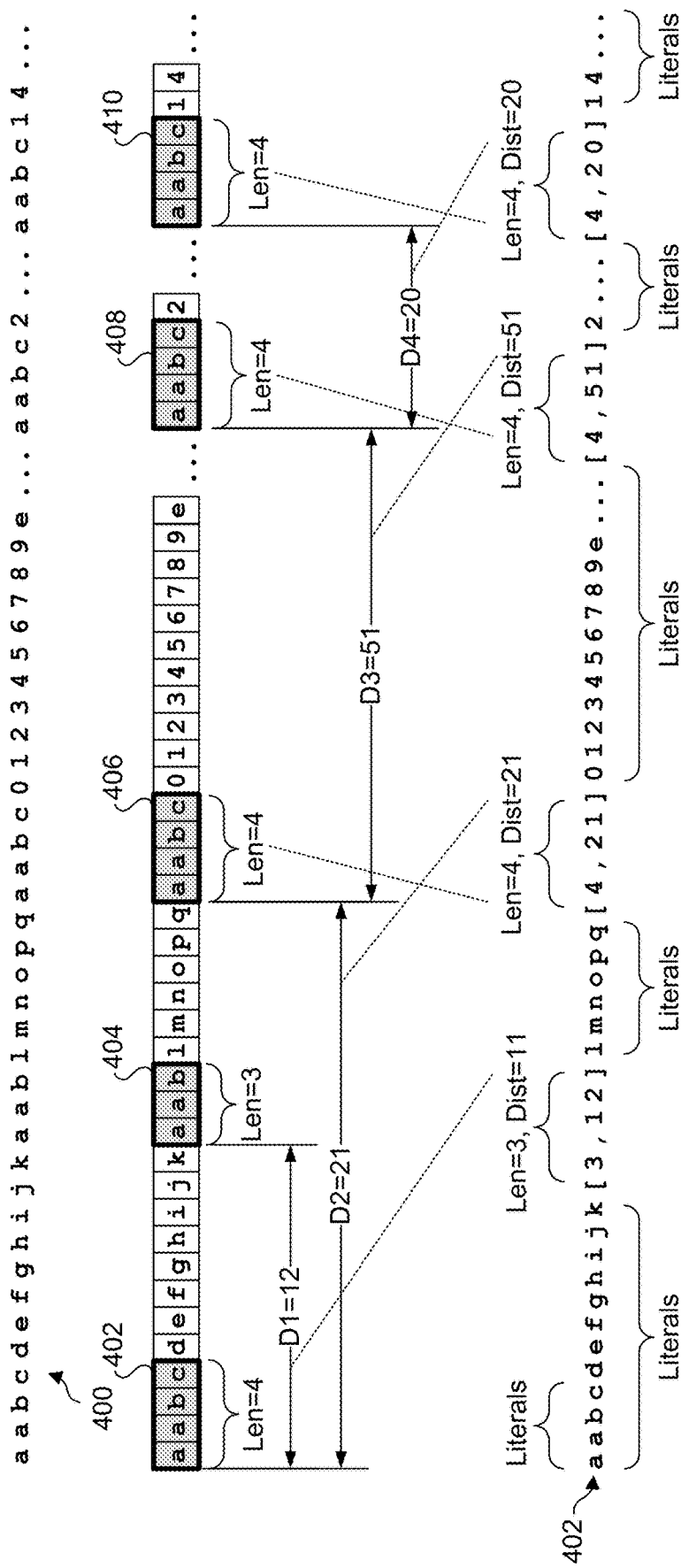
FIG. 4 is a diagram illustrating encoding a character string using conventional LZ77 encoding.

FIG. 4 depicts how a character string in a byte stream 400 is encoded into an encoded stream 402 using a conventional implementation of the LZ77 compression scheme using the operations and logic of flowchart 300. For illustrative purposes, the byte streams herein are shown using character strings rather than the actual byte values used by ASCII. As illustrated, the character string includes an 'a a b c' block 402, an 'a a b' block 404, an 'a a b c' block 408, and an 'a a b c' block 410 interspersed with various other alphanumeric characters. Since LZ77 encodes and decodes from a sliding window over previously seen characters, decompression must always start at the beginning of the input, which begins with 'a', 'b', 'c', 'd', 'e', etc. for byte stream 400. In this example implementation, the minimum matching length ('len') is 3, the same as used in DEFLATE.

Using the sliding window comparison scheme described above with reference to FIG. 1, no matches with a length of at least 3 would be detected until 'a a b' block 404 is reached, which matches the first three characters of 'a a b c' block 402. In accordance with decision block 306 and block 310 of flowchart 300, up until the position and the start of 'a a b' block 404, byte stream 400 would be encoded as literals 'a', 'a', 'b', 'c', 'd', 'e', 'f,' 'g', 'h', 'k' in encoded stream 402. Since the match of 'a a b' block 304 has a length of 3, the ASCII byte values for literals 'a', 'a', 'b' would be encoded as [3,12], representing a length of 3 at a distance of 12 from the matching 'a a b' substring in 'a a b c' block 302. Similarly, after a sequence of literals 'l', 'm', 'n', 'o', 'p', 'q', block 'a a b c' 306 would be encoded as [4, 21], followed by literals '0', '1', '2', '3', '4', '5', '6,' '7', '8', '9', 'e', . . . , [4, 51] for block 'a ab c' 308, literals '2', . . . , [4, 20] for block 'a a b c' 310, and literals '1', '4' . . . .

The process of decompressing DEFLATE streams is effectively the inverse of compressing DEFLATE streams and has two phases:

1. Decoding the input stream into tokens (literals or references to repeated strings)
2. Copying either the literal bytes or repeated strings (with specified length/offset) to the output stream (LZ77 back-end output generation)

Even for data sets with average compressibility, we observe that <20% of the symbols are literals, and the significant portion are references. Therefore, it is good to protect the references from errors. Another reason is that an error in a reference has a bigger impact than a corrupted literal symbol, as references generally represent many bytes.

In accordance with embodiments herein, a small amount of parity information (e.g., 1-bit) is encoded into the references that the decompressor will check. Since references are very frequent, an error will usually be detected within a few bytes, thus localizing the error. Under some embodiments, only some references are selected to be used to encoded parity information when searching for the best match at a given position, while other embodiments may encode all references. Under one embodiment, the compressor picks the longest match at the shortest distance after (potentially) examining many candidates (e.g., 64). Under one approach, only references where a parity value determined as a function of the length and distance, such as (length+distance) mod 2, is equal to a matching parity value is picked. Other parity match schemes may also be used, such as schemes based on distance (only), or distance combined with one or more other parameters.

An important consideration is to determine what the matching parity should be. Some possibilities include:

1. A fixed parity for all references, e.g., '0' or '1'
2. Some random string of bits that the compressor and decompressor know a priori that are used for the parity of successive references.
3. The parity of the input data up-to this point (e.g., cumulative parity up-to the current position in the byte stream)

The following pseudocode in LISTING 1 provides one embodiment of an augmented LZ77 compression scheme using the parity calculation scheme 3, where the parity for the current position in the byte stream is determined using a cumulative calculation over all the bytes up to the current position.

LISTING 1

```
1   // Parameters and Variables:
2   // gxor is cumulative bitwise XOR up to position
3   // gcnt is global count
4   // mypar is used to define whether parity match is in use
5   // d = distance
6   // len = length of matched string
7   // pos = position in Byte Stream
8   // match4 is a count of matches at a given len among candidates
9
10  // @ position pos
11  parity = bit-xor(gxor); // xor all 8 bits in the gxor Byte
12  if (gcnt > BSKIP) {mypar=1; gcnt=0;}
13  // BSKIP is after how many bytes to encode references
14
15  for(d=1; d<litdist &&(match4 <64); d = getnextcandidatedist( )){
16      for(len=0; len<maxc; len++){// maxc is max string match length
17          if (inp_buf[pos+len] != inp_buf[pos-d+len]) break;
18      }
19
20      val = (len >=3); // 3-byte minimum match for Deflate
```

LISTING 1

```
21      if (((len ^ d) &0x1) != parity) && mypar
22          if (len > 3) len--; // reduce length by 1, at same distance
23          else val = 0;
24
25      if (val){match4++; if (len >bestlen){bestlen=len; bestd = d;}}
26  }
27
28      gxor ^= inp_buf[pos]; gcnt++; // update global cumulative xor
29                                    // and global count
30      if (bestlen){
31          for(i=1+pos; i<bestlen+pos; i++){
32              gxor ^= inp_buf[i]; gcnt++;
33          }
34  }
```

Figure 5:
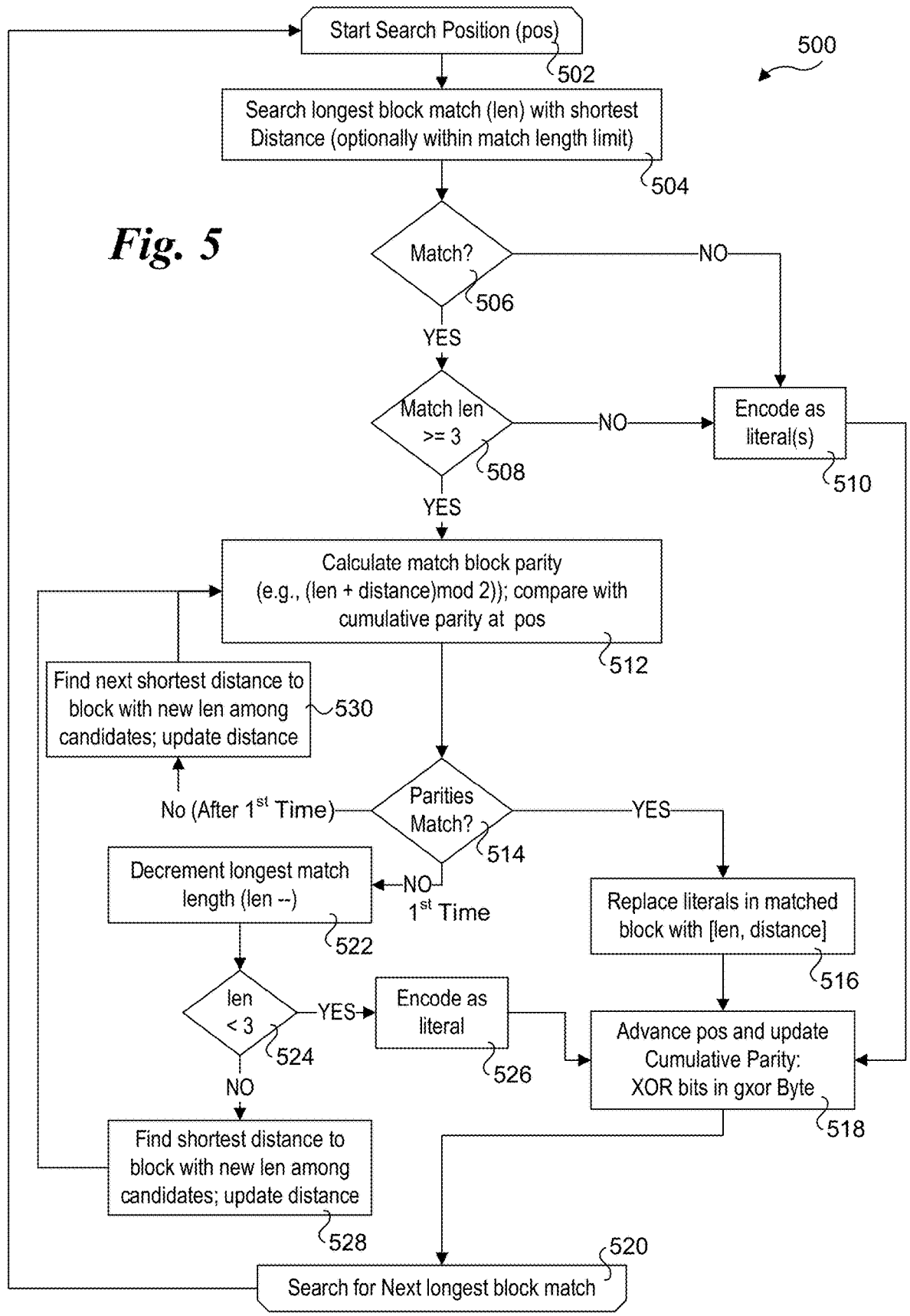
FIG. 5 is a flowchart illustrating operations and logic for implementing an augmented LZ77 encoder that encodes hidden parity information, according to a first embodiment.

FIG. 5 shows a flowchart 500 illustrating operations and logic for performing an augmented version of LZ77 encoding using the aforementioned parity-matching scheme and in accordance with the pseudocode of LISTING 1, according to one embodiment. The operations and logic of start block 502, block 504, decision block 506 and 508, block 510, and end loop block 520 are similar to start block 302, block 304, decision block 306 and 308, block 310, and end loop block 316 of flowchart 300, and are performed using the conventional approach. However, the operations performed in response to a block match having a length of at least 3 are substantially different than the convention approach used for LZ77, as follows.

In a block 512 a parity match calculation is performed under which a cumulative parity calculated over all of the previous bytes up to the position corresponding to the start of the matching block is compared with a parity value calculated as a function of the len and distance. For example, under line 21 of LISTING 1 the parity value is determined by performing a bitwise XOR of the bits in len and distance. As another option, the parity value could be determined using distance+len)mod 2. As depicted in lines 11 and lines 28 of LISTING 1, the global cumulative XOR value for the current position is updated whenever the position (pos) is advanced.

As depicted by a decision block 514, if the block match parity and the cumulative parity at pos match, the logic proceeds to a block 516 wherein the literals in the match block are replaced with [len, distance] in a manner similar to that used by conventional LZ77 encoding. The search start position pos is then advanced by the length of the block and the cumulative parity at the new pos it updated in block 518. The logic then loops back from end loop block 520 to start loop block 502 to begin searching for the next longest block match beginning at the new pos.

If there is no parity match, the answer to decision block 514 is NO, and if this is the first time through the logic proceeds to a block 522 in which the longest match length is decremented, resulting in a substring with the last literal removed. As depicted by a decision block 524, if the new len is less than 3, the remaining two bytes will be encoded as literals in a block 526, and then proceed to block 518 to advance pos (by two) and update the cumulative parity using the new pos. If the new len is at least 3, the logic will proceed to a block 528 in which the shortest distance to a block among potential candidates that matches this substring of the (now) shortened block is determined, which results in updating the distance (if the new distance is shorter than the previous distance for the prior block length). The logic then loops back to block 512 where the match block parity is recalculated based on the updated distance and len values, and then the operations and logic of block 514, 516, 518, 522, 524, 526, and 524 are repeated, as applicable. However, for this and subsequent loops (at a given pos), if the parities do no match in decision block 514 the logic proceeds to a block 530, where the next shortest distance to a matching block with the new len among the candidates is determined. Looping between blocks 512, 514, and 530 will continue using the parities match. It is noted that under this embodiment a parity match will be guaranteed when the distance for the original len is reached (if a parity match for a shorter distance for len-1 is not found earlier).

Figure 6:
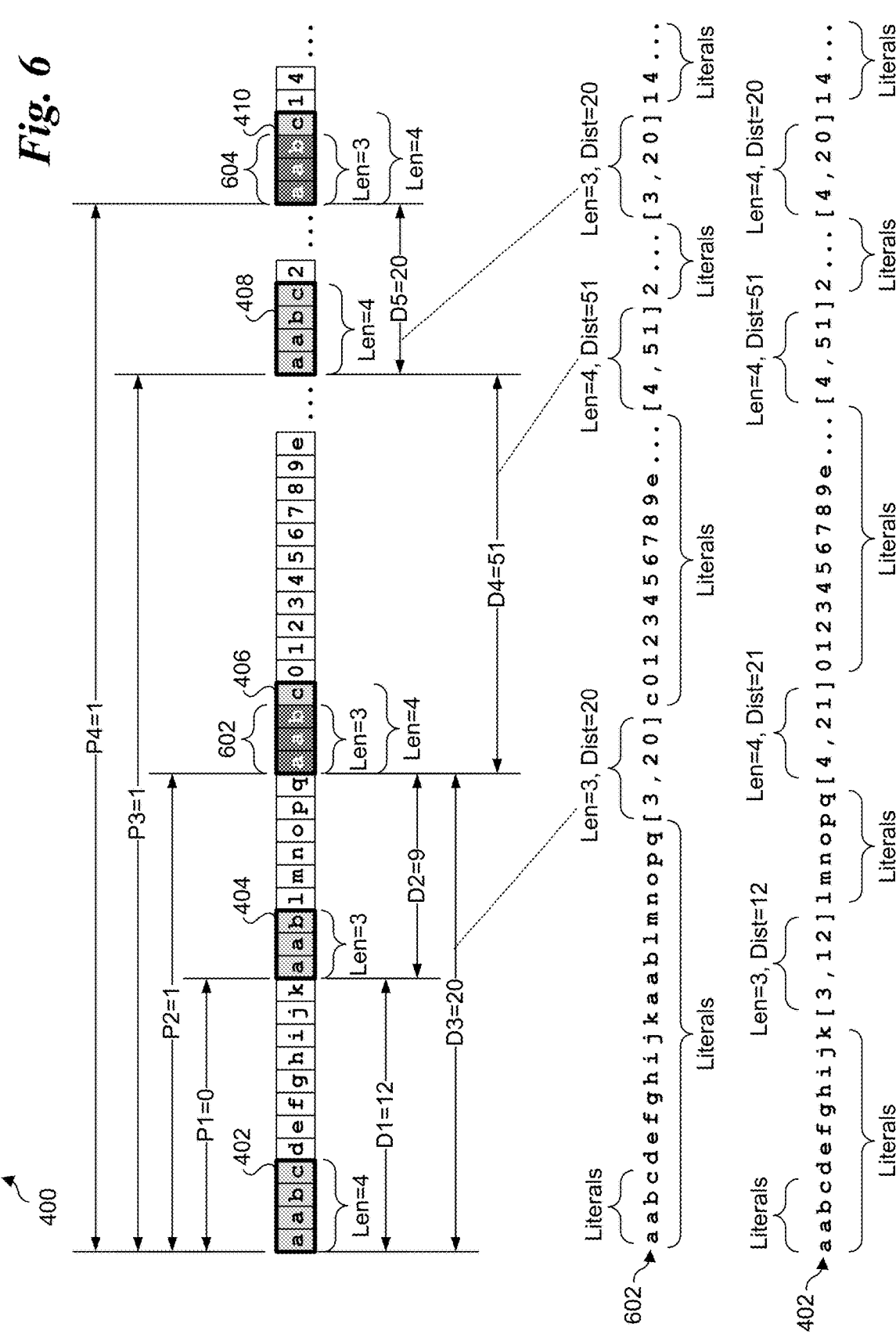
FIG. 6 is a diagram illustrating encoding the character string of FIG. 4 using the augmented LZ77 parity-encoding scheme of FIG. 5.

FIG. 6 illustrates an example of how byte stream 400 is encoded as an encoded stream 600 using the operations and logic of flowchart 500. The beginning of byte stream 400 would be processed in the same manner described above, resulting in the literals 'a', 'a', 'b', 'c', 'd', 'e', 'f,' 'g', 'h', 'i', 'j','k'. Also, as before, a match of length 3 would be detected between 'a a b' block 404 and the first three bytes of 'a a b c' block 402 in block 504. The answers to both decision block 506 and 508 would be YES, causing the logic to proceed to a block 512.

In block 512, a parity calculation is calculated is a function of the distance and len for the matched block. In the illustrated embodiment, the function is (distance+len)mod 2. The resulting parity is (12+3)mod 2=1. This parity is compared with the cumulative parity for the current pos, which corresponds to the pos at the beginning of 'a a b' block 404. For illustrative purposes this parity P1='0'. In decision block it is determined that the parities do not match, causing the logic to proceed to block 522 in when len is decremented by 1 and is now len=2. As a result, the answer to decision block 524 is NO, and 'a' 'a' and 'b' are encoded as literals in sequence. Subsequently, there is no match found having a length of at least 3 for characters '1', 'm', 'n', 'o', 'p', 'q', which are encoded as literals. Thus far, in encoded stream 600 we have a string of literals 'a', 'a', 'b', 'c', 'd', 'e', 'f,' 'g', 'h', 'i', 'j', 'k', 'a', 'a', 'b', 'l', 'm', 'n', 'o', 'p', 'q'.

At this point, pos, the current position, is at the start of 'a a b c' block 406, which is 20 bytes from the start of byte stream 400. In conjunction with adding each literal to the encoded stream, pos is advanced by 1 and the cumulative parity of pos is recalculated in block 518. As depicted by parity P2, the cumulative parity for this pos is '1'. When the block match parity is calculated in block 512, the result is (20+4)mod 2=0. Thus, there is a mismatch in parities and the logic proceeds to decrement len by 1 in block 522 to len=3, with the new block to be used for matching being shortened to 'a a b' block 602. Since len=3, the answer to decision block 524 is NO, resulting in the logic proceeding to block 528 to find the shortest distance to a match for 'a a b'. The nearest 'a a b' is 'a a b' block 404 at a distance D2=9. When the parities are compared in decision block 514 the result is a mismatch since (9+3)mod 2=0 and parity P2=1. This is the second time through, so the parity mismatch results in the logic proceeding to block 530 rather than block 522. In block 522 the next shortest distance to block 'a a b' is found, which corresponds to the first 3 bytes of 'a a b c' block 402 at a distance D3 of 20. Since (20+3)mod 2=1, there will be a parity match the next time through the loop in decision block 514, with the logic proceeding to block 516 in which literals 'a a b' will be encoded by as [3, 20] in encoded stream 602.

The next match block encountered is 'a a b c' block 408, which begins at a pos that is 71 bytes from the start of byte stream 400. Since there are no matches from pos 23-71, these characters would be encoded as literals 'c', '0', '1', '2', '3', '4', '5', '6,' '7', '8', '9', 'e', . . . , noting the 'c' is encoded as a literal since it is no longer part of 'a a b' block 602. As illustrated, the parity P3 at this pos is 1. The nearest matching block is 'a a b c' 406 at a distance D4=51, which correspond to a block match parity=(4+51)mod 2=1. When the parities are compared in decision block 514 the result is a match, and the logic will proceed to block 516 to encode 'a a b c' block 408 as [4, 51].

The next matching block found is 'a a b c' block 410, which has a nearest match of 'a a b c' block 408 at a distance D5=20. The pos is 91 bytes from the start of byte stream 400 and the parity P4 at this pos is illustrated as P4=1. Since (4+20)mod 2=0, there is a parity mismatch, resulting in len being reduced by 1 to 3 and the shorting 'a a b c' block 410 to an 'a a b' block 604. The nearest match to 'a a b' block 604 is the first three bytes of 'a a b c' block 408 at the same distance 20. This time there will be a parity match, since (3+20)mod 2=1. Thus 'a a b' block 604 will be encoded [3, 20], followed by literals 'c', '1', '4', . . . .

Figure 5A:
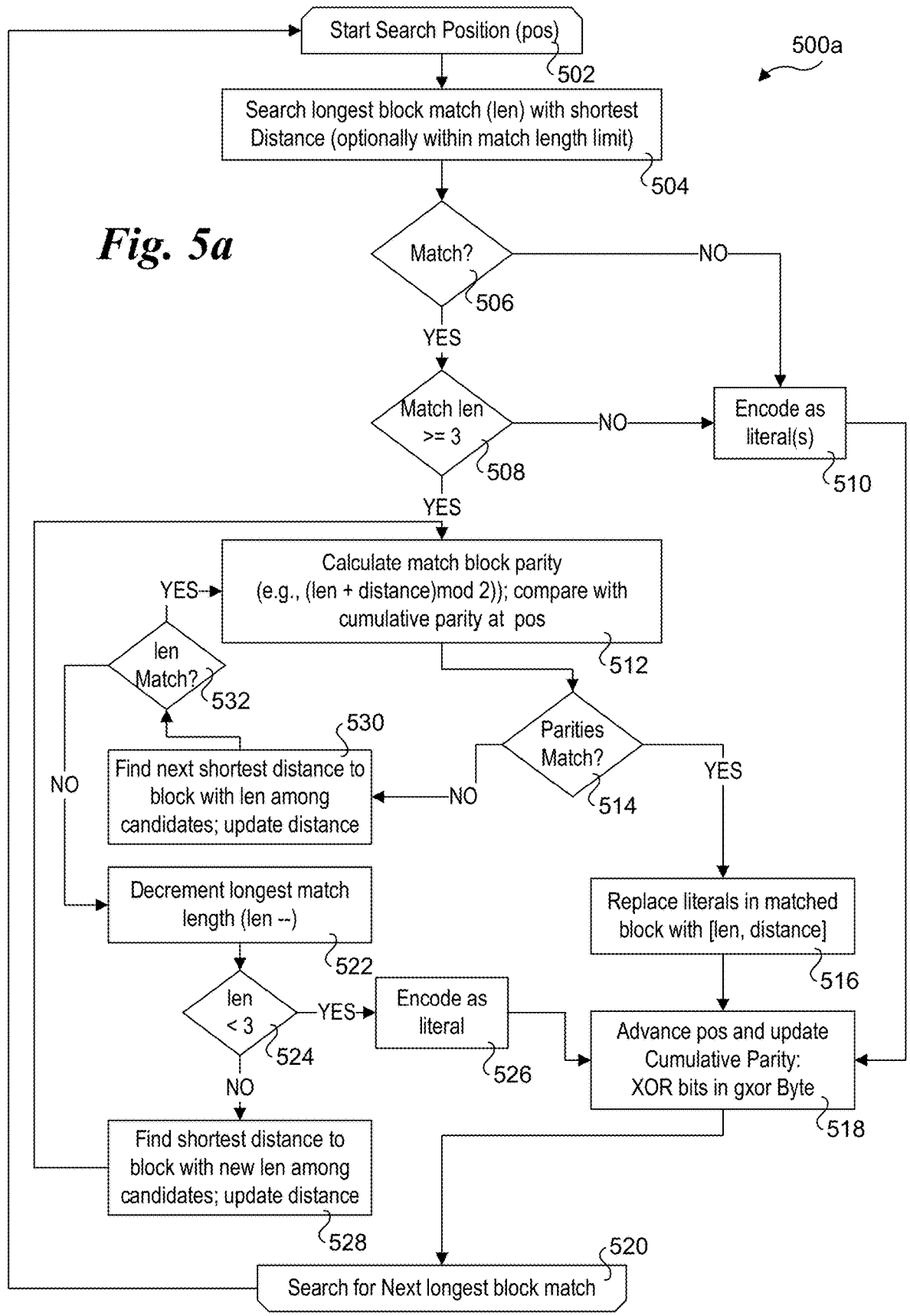
FIG. 5a is a flowchart illustrating operations and logic for implementing an augmented LZ77 encoder that encodes hidden parity information, according to a second embodiment.

FIG. 5a shows a flowchart 500a illustrating operations and logic corresponding to an alternate parity encoding scheme, according to one embodiment. In flowcharts 500 and 500a like-numbered blocks perform similar operations. Accordingly, the following discussion will focus on the difference between flowcharts 500 and 500a.

Under the scheme in flowchart 500a, rather than immediately decrementing len by 1 in response to a parity mismatch, the logic will search for the next nearest block match with the same len, performing a new parity check for each found match until either the parities match in decision block 514 or there are no more matches at that len, as depicted in a decision block 532. In response to not finding a match at the original len, the logic proceeds to decrement len in block 522. Subsequently, the logic will loop looking for the next nearest match for a block length of len-1 and performing the parity match check until a match is found. There will always be at least one match for len-1 at the same distance as the match for len using the (distance+len)mod 2 parity scheme, since distance will be the same and thus the result of the parity calculation will be different for len and len-1 for any substring of length len.

Figure 6A:
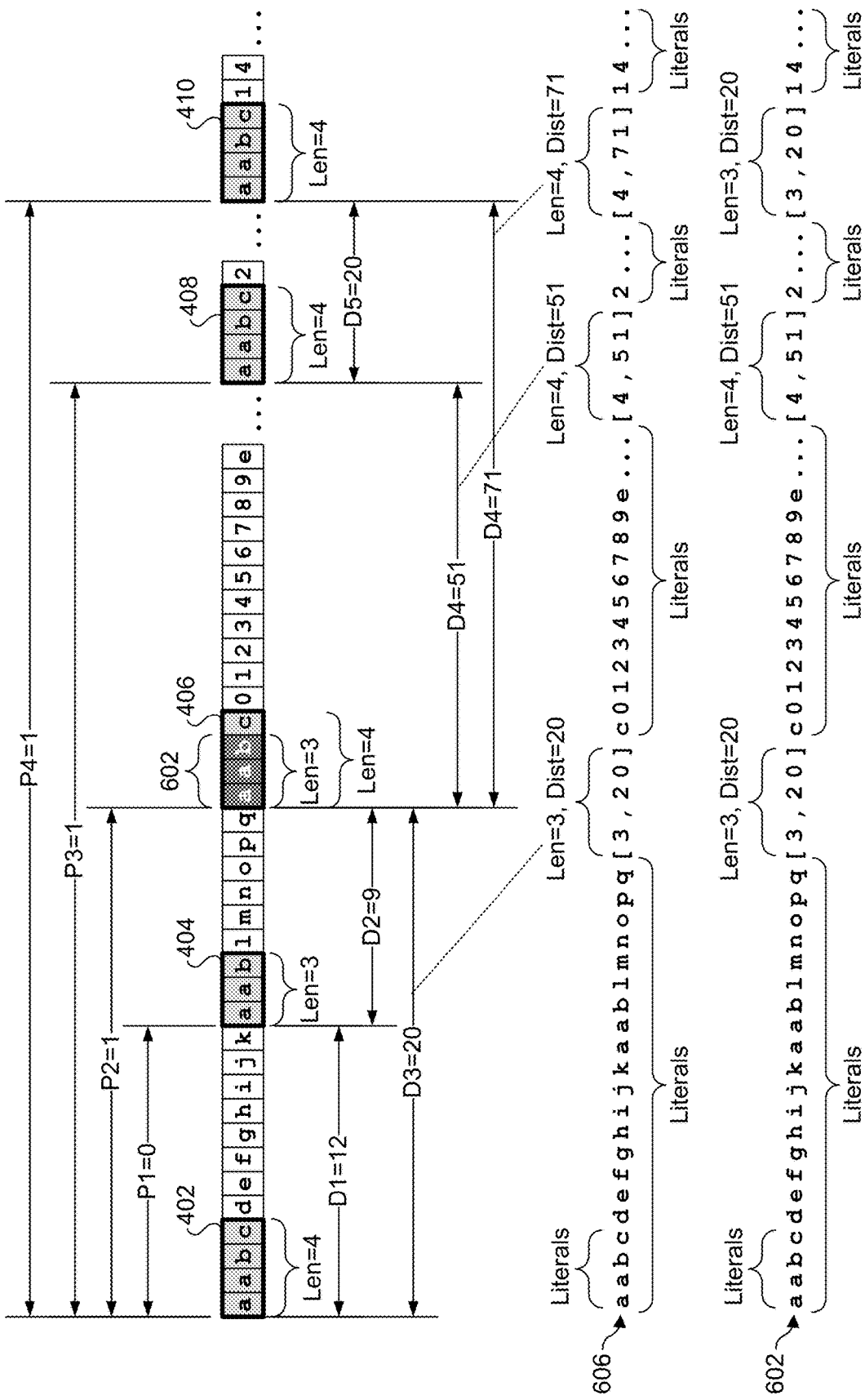

FIG. 6a illustrates an encoded stream 606 that is produced using the operations and logic of flowchart 500a to encode hidden parity information. When 'a a b c' block 406 is encountered, a match to 'a a b c' block 402 is found at a distance D3=20, resulting in a parity mismatch. Since there are no more matches for 'a a b c' the logic will proceed to decrement len to 3 and then a match using 'a a b' block 602 will be performed. As with encoded stream 602, the match of 'a a b' block 404 will result in a parity mismatch, and 'a a b' block 602 will be encoded as [3, 20].

Subsequently, since there will be a parity match for 'a a b c' block 408, it will be encoded as [4, 51], which again is the same as in encoded stream 602. As before, when 'a a b c' block 410 is processed, a match of 'a a b c' block 408 will be detected at a distance of 20, resulting in a parity mismatch. However, rather than decrement len, a search for the next nearest 'a a b c' block is performed, which corresponds to 'a a b c' block 406 at a distance of 71. Since (4+71)mod 2=1 and P4=1, there is a parity match, and 'a a b c' block 410 will be encoded as [4, 71].

Figure 7:
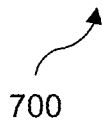
FIG. 7 show a snippet from the file progc from the Calgary data corpus.
Figure 8:
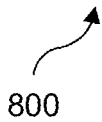
FIG. 8 shows a table comparing the encoding for portion of the snippet in FIG. 7 shown in gray using a conventional encoder and a matched-parity encoder, according to one embodiment.

FIGS. 7 and 8 illustrate an example comparing the encoded streams using conventional LZ77 encoding and an embodiment of LZ77 with parity-encoding for a small snippet 700 from the file progc from the Calgary data corpus (FIG. 7). The snippet starts at position 39,034 characters into the file, and covers the next 156 bytes. When the snippet is encoded using the longest match shortest distance (the conventional approach, referred to as the baseline scheme), the result is a compression ratio of 33.33%, with 18 references. When the snippet is encoded with an implementation of the match-parity encoding scheme disclosed herein, the output has a compression ratio of 34.61% with 19 references. Though a small amount of compression ratio is lost, these 156 bytes are essentially covered by ~19 bits of parity information.

FIG. 8 shows a table 800 illustrating the differences in how the following portion of the snippet 700 is encoded using the conventional approach and an embodiment of this disclosure (this portion is also highlighted in gray in snippet 700 in FIG. 7).

q/100, q % 100);
}

The characters of the foregoing string (including ASCII punctuation characters) are depicted in the Character column. The matches are shown as references (R) with (length, distance) information for the first character of each reference. For example, the first reference R (Len=6, d=163) is followed by 5 rows with a value of 'R', indicating these characters are part of this first reference (are in the matched block having a Len of 6). Cells that do not have R imply that the character in that row was encoded as a literal. For example, the 'q' in the first row is encoded by both schemes as a literal. The second 'q' is encoded as a reference in the baseline scheme but as literal in the match parity-encoding scheme. Conversely, the '%' is encoded as a literal in the baseline scheme, but as a reference in the match-parity scheme.

Toward the end of table 800 (as depicted by the gray background in the last four rows), both schemes encode the exact same reference, while in the middle the schemes find different matches. In this case, both schemes cover the same number of bytes with matches; however, under the match-parity scheme there is one more reference symbol and some distances are larger, with the result being a slight loss in compression ratio, but with the benefit of adding the parity information.

The embodiments described above may be augmented using various extensions to parity-encode selected references rather than all references. For example, one implementation is illustrated in lines 12-13 of LISTING 1. Under this approach, BSKIP defines a minimum distance between parity-encoded references in the encoded stream. Following a parity-encoded reference, the next parity-encoded reference will be at a location in the encoded stream of at least B SKIP bytes after the pos for the preceding parity-encoded reference. As a result, the number of parity-encoded references are reduced. To parity-encode all references (if desired), B SKIP is set to 0.

Another approach is to use parity-encoding for every $N^{th}$ reference. For example, suppose parity-encoding is used for every $5^{th}$ reference, with conventional reference encoding used for the other references. The result for snippet 700 is a compression ratio of 33.97% with 19 references but only 8 of them are encoded references. Thus, a better compression ratio is obtained, with ~8 bits worth of parity information encoded for the same small block of 156 bytes. A comparison of compression ratios and encoded bits of parity using the foregoing schemes is illustrated in TABLE 1 below.

TABLE 1

| Ratio | Encoded bits of parity | Skip Bytes |
|---|---|---|
| 33.33 | None (baseline) | NA |
| 33.97 | 8 | 5 |
| 34.61 | 19 | 0 |

Figure 9:
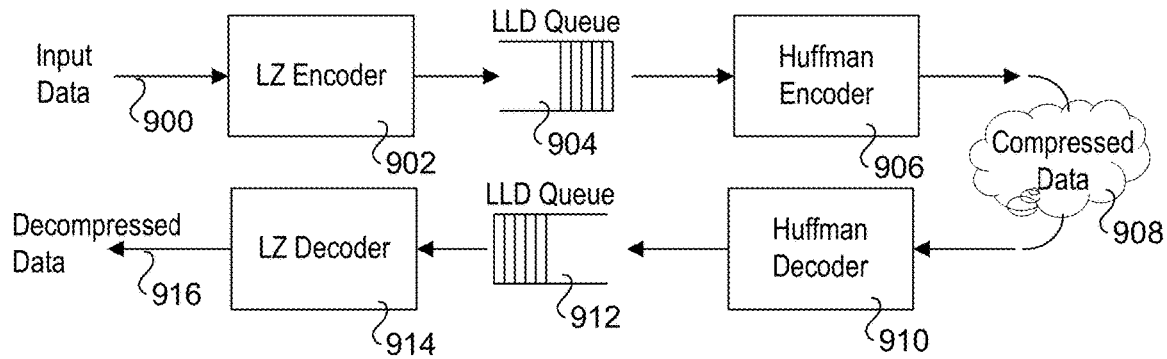
FIG. 9 is a diagram illustrating a conventional DEFLATE compression and decompression process flow.
Figure 10:
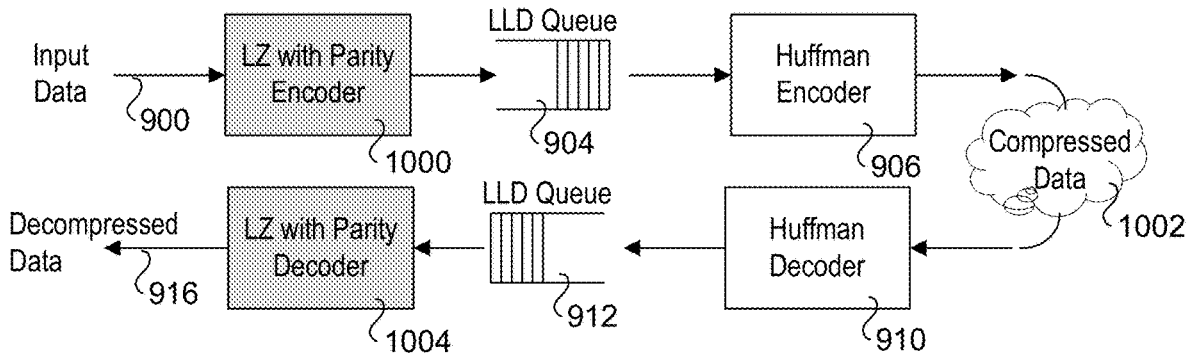
FIG. 10 is a diagram illustrating a modified DEFLATE compression and decompression process flow that includes an LZ parity encoder and decoder in accordance with one or more embodiments herein.
Figure 10A:
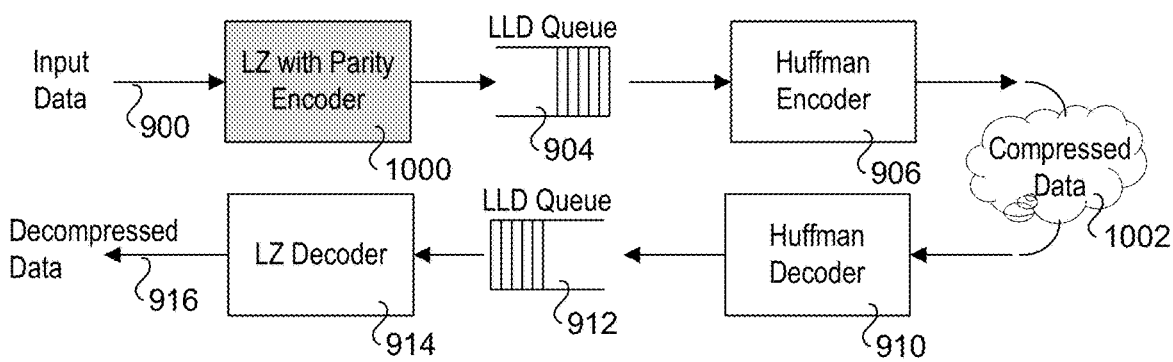
FIG. 10a is a diagram illustrating a modified DEFLATE compression process including an LZ parity encoder in accordance with one or more embodiments herein and a conventional DEFLATE decompression process.

FIG. 9 shows the process flow and primary processing blocks for an end-to-end DEFLATE scheme, while FIGS. 10 and 10a show augmented implementations of DEFLATE the may be provided using aspects of the embodiments disclosed herein. Under the conventional DEFLATE scheme, input data, in the form of a file or byte stream (depending on the implementation) is input to an LZ encoder 902 (e.g., and encoder using LZ77 compression). LZ encoder 902 performs string matching as described above with reference to FIGS. 1 and 3 using hash schemes, hash tables, and a history buffer. The output of the LZ encoder is a queue, called the LLD (literals and length/distance) queue 904, which stores the symbols generated during the LZ encoding stage. The output of LLD queue 904 is processed by a Huffman encoder 906 which results in a standards-compliant compressed bit stream depicted as compressed data 908.

The compression scheme cannot start Huffman encoding until it has computed the Huffman codes, and it cannot compute the Huffman codes until it knows the frequency of each symbol in the Huffman alphabet. The symbols and their frequencies are derived by LZ encoder 902. Under one implementation that uses 512 Huffman symbols, the final compression format consists of two parts:

1. The first 256 bytes indicate the bit length of each of the 512 Huffman symbols.
2. The remainder of the data is a sequence of Huffman symbols, along with match lengths and distances.

The Huffman alphabet consists of 512 symbols, each with a numeric value in the range 0-511. The symbols 0-255 represent literal values that correspond to raw byte values as opposed to matches. The symbols 256-511 represent matches or references indicating that the next several bytes are the same as some bytes that previously occurred in the data. As described above, each match consists of two encoded integers: a length (len) and a distance (d).

Compressed data 908 may be stored in compressed form (by writing it to a file, such as a gzip or PKZIP file, or other file format that uses DEFLATE), or streamed to a recipient, sometimes referred to as a client. Under the scheme illustrated in FIGS. 9, 10, and 10a, the compression operations are performed by a first computing device or computer system, such as a server, and compressed data 908 and 1002 is streamed over a network or fabric to a second computing device or computer systems, such as a client (e.g., laptop, notebook, desktop computer, mobile phone, tablet, etc.

Decompression operations are performed by the second computing device/system/client. The process is somewhat less complex in the decompression path. Compressed data 908 is decoded in a Huffman decoder 910, which constructs a stream of symbols that are enqueued in an LLD queue 912. An LZ decoder 914 processed the symbol stream to reconstruct the original data as decompressed data 916, which does not require hashing or hash tables. When LZ decoder 912 encounters a match symbol, the original data is reconstructed by copying <length> bytes from the position in its previously decompressed data of <[decompression cursor]–[match distance]>.

The overall scheme under the embodiments herein is similar to the conventional DEFLATE scheme illustrated in FIG. 9, with the following differences. First, rather than using a conventional LZ encoder, and LZ with parity encoder 1000 is used, which encodes the byte stream with parities for all or selected references using one of the embodiments described above. Both the Huffman encoder 906 and 910 are agnostic to the parity-encoding schemes. From the perspective, of Huffman encoder 906, the byte stream output from LZ with parity encoder 1000 looks like a conventional byte stream compressed using LZ77 encoding. The output of Huffman encoder 906 is compressed data 1002, which may be stored as using a conventional DEFLATE file format just as gzip, PKZIP, etc.

Huffman decoder 910 uses conventional Huffman decoding operations to decode compressed data 1002, which is queued in LLD queue 912. At this point, the augmented DEFLATE with parity check scheme shown in FIG. 10 departs from the conventional LZ decompression process by performing parity-checks for references that were encoded with parity information by LZ with parity encoder 1000. Generally, as the decompress data 916 is being generated, a parity comparison will be performed using the same scheme used for encoding the parity information. For example, in one embodiment one of the parity values will be the cumulative parity for the decompressed output byte stream up to a current pos, with the second parity value being derived from the len and distance values in the reference (e.g., (len+distance)mod 2). If there are no errors, the parities will match for each reference encoded with parity information. Detection of a parity mismatch indicates that there is an error in the received compress data (e.g., the received compressed byte stream. Further details of the decompression with parity check process are described below with referenced to FIG. 11.

The augmented DEFLATE process shown in FIG. 10a illustrates one of the inherent aspects of the parity-encoded compression schemes disclosed herein: the entire decode/decompression process may be performed with a conventional Huffman decoder and LZ decoder, as depicted by Huffman encoder 910 and LZ decoder 914. In this instance, the parity information encoded into the compressed byte stream is simply ignored during LZ decoding. As the parity-encoder LZ compression schemes all produce valid LZ77 byte streams, they may be decompressed using any standard-compliant DEFLATE decompressor.

Figure 11:
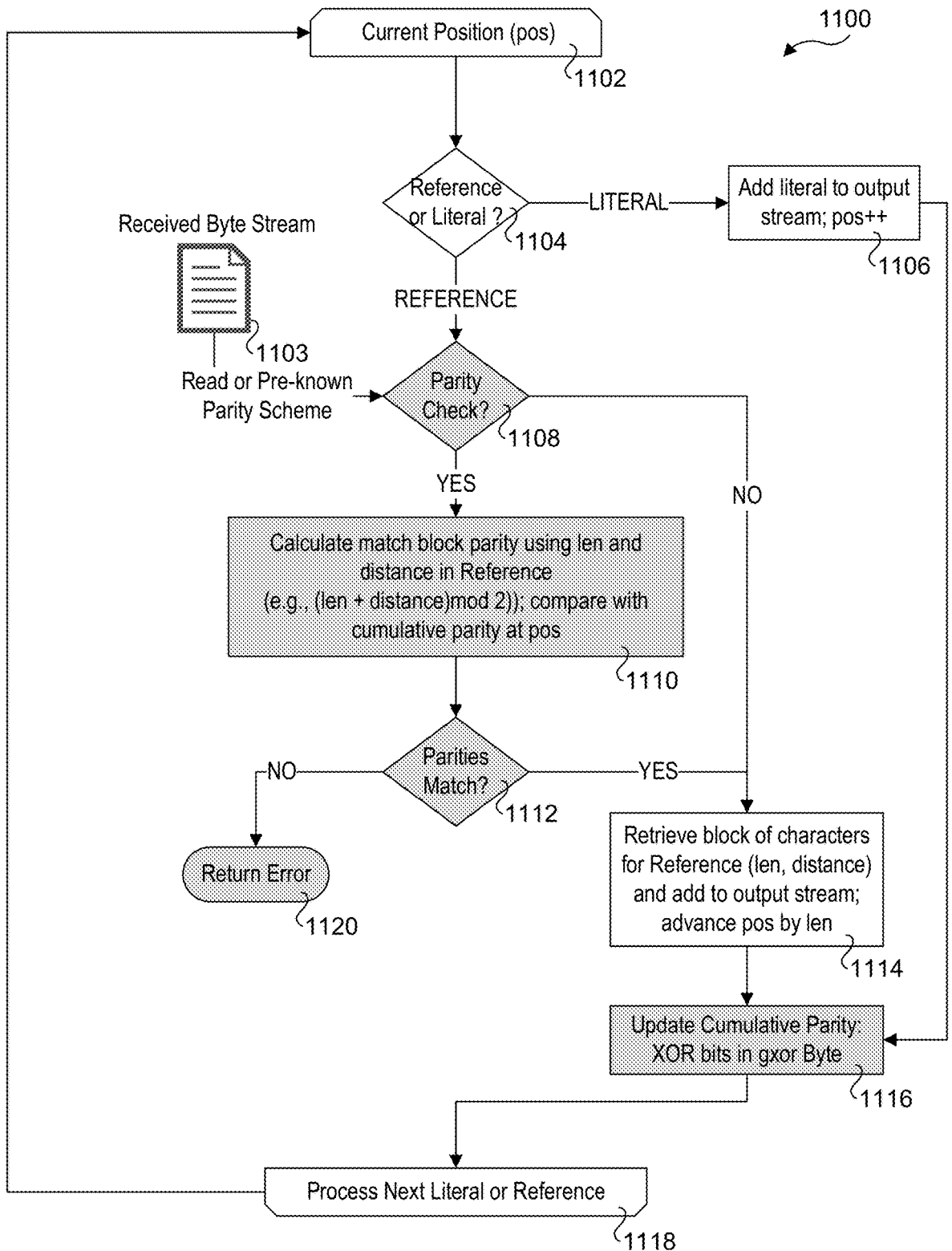
FIG. 11 is a flowchart illustrating operations and logic performed by an LZ with parity decoder, according to one embodiment under which a cumulative parity is used for the parity check.

FIG. 11 shows a flowchart 1100 illustrating operations and logic performed by LZ with parity decoder 1004, according to one embodiment under which a cumulative parity is used for the parity check. As depicted by start and end loop block 1102 and 1118, the process is repeated iteratively until the received byte stream 1103 has been processed. The loop begins at a current position (pos). In a decision block 1104 a determination is made to whether the received byte stream includes a literal or a reference at the current pos. If it is a literal, the literal is added to the output stream and pos is incremented by 1 in a block 1106. The logic the proceeds to a block 116 in which the cumulative parity is updated for the new pos, and then the process loops back from end loop block 1118 to start loop block 1102 to evaluate the next literal or reference.

If the answer to decision block 1104 is a reference, a determination is made in a decision block 1108 to whether a parity check is to be made. The particular parity encoding scheme that is used may either be read from the start of received byte stream 1103 or known in advance. For example, a pre-known parity-encoding scheme may be used in an enterprise or data center environment, or may be used with a client application that utilizes a modified DEFLATE decompressor, such as a cloud-storage application. As discussed above, under different approach all references may be encoded with parity bit, or selected references may be encoded, such as every $N^{th}$ reference or using the minimum B SKIP scheme.

If a parity check is not to be performed for a particular reference, the answer to decision block 1108 will be NO, and the logic will proceed directly to block 1114, in which the block of characters for the reference (at len, distance) are retrieved or read (e.g., from a buffer) and added to the output stream. The position is then advanced by len, the length of the referenced block. If a parity check is to be made for the current reference, the logic proceeds to a block 1110 in which the match block parity using the len and distance in the reference is calculated, such as using (len+distance)mod 2, as before. The particular match block parity scheme may either be known in advance or identified in received byte stream 1103. The block match parity value will them be compared with the cumulative parity value at pos. If they match, as determined in a decision block 1112, the logic will proceed to block 1114. If the parities do not match, then an error is present in received byte stream 1103, and the logic proceeds to return an error in a return block 1120. In one embodiment, the current position at which the error is detected is also returned along with indicia indicating an error has been detected.

Figure 11A:
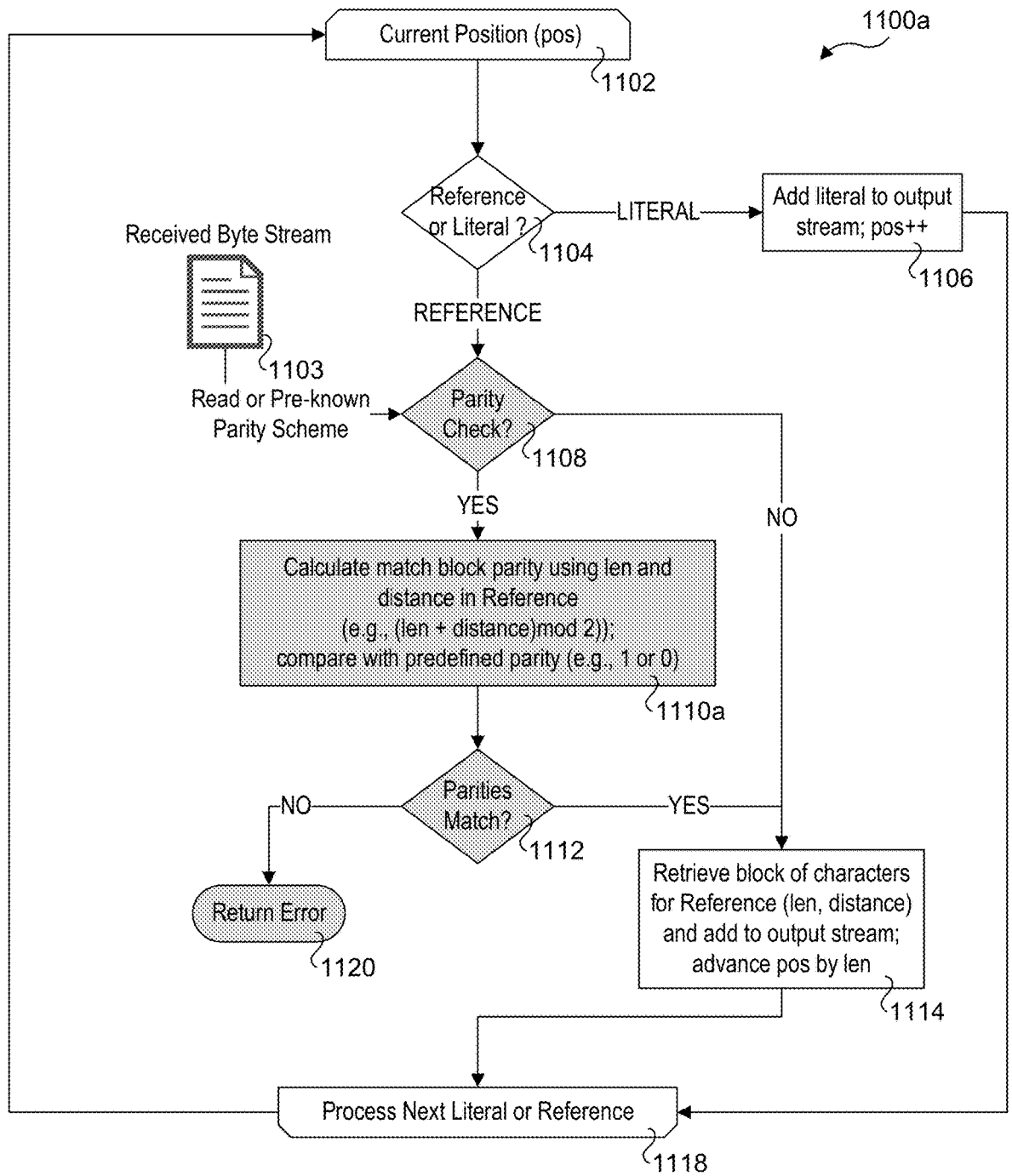
FIG. 11a is a flowchart illustrating operations and logic performed by an embodiment of an LZ with parity decoder that uses a predetermined parity value.

FIG. 11a shows a flowchart 1100a illustrating operations and logic performed by an embodiment of an LZ with parity decoder 1004 that uses a predetermined parity value such as '1' or '0'. As depicted by like-numbered blocks, the processes for flowcharts 1100 and 1100a are similar, except that predetermined parity is used for comparison purposes in blocks 1110a and decision block 1112 rather than a cumulative parity. As a result, block 1116 has been removed in flowchart 1100a.

Aspect of the foregoing encoding schemes may also be extended to support multi-bit parity. For instance, the first reference, a first bit-lane parity would be encoded, for the second reference a second bit-lane parity would be encoded, and so on until the eight reference (for which an eighth bit lane parity would be encoded), at which point the parity-bit to be encoded would return to the first parity lane, with the process being repeated through the eight parity lanes. More generally, this approach could be applied to a multi-bit parity scheme employing two or more parity-bit lanes.

Application to ZStandard

The principles and teachings disclosed herein may be applied to other compression/decompression schemes in addition to DEFLATE schemes. As described above, similar approaches may be applied to LZ4 and ZStandard compression/decompression schemes (as modified to support parity-encoding). Generally, the principles and teaching may be applied to any compression/decompression scheme employing an LZ-based encoding and decoding scheme, such as but not limited to LZ77.

Zstandard is a real-time compression scheme, providing high compression ratios. It offers a very wide range of compression/speed trade-off, while being backed by a very fast decoder. It also offers a special mode for small data, called dictionary compression, and can create dictionaries from a sample set using training. Zstandard library is provided as open source software available at https://facebook.github.io/zstd/.

Zstandard combines the use of a dictionary-type scheme (LZ77) with a large search window and fast implementations of entropy coding stage, using either very fast Finite State Entropy (tANS, based on Asymmetric Numeral Systems) or a variant of Huffman coding called Huff0 for entropy encoding. A feature of the Zstandard implementations is backward direction of reading on entropy decompression.

While zlib is limited to a 32 KB window, Zstandard leverages the much greater availability of memory in modern systems, including mobile and embedded systems, and does not impose any inherent limit on the window size. A new Huffman decoder, Huff0, is used to decode symbols in parallel using multiple ALUs (Arithmetic Logic Units) by reducing the data dependencies between arithmetic operations.

Generally, the smaller the amount of data to compress, the more difficult it is to compress. This problem is common to all compression schemes, as compression schemes learn from past data how to compress future data. However, at the beginning of a new data set, there is no "past" to build upon.

To solve this situation, Zstandard offers a training mode, which can be used to tune the scheme for a selected type of data. Training Zstandard is achieved by provide it with a few samples (one file per sample). The result of this training is stored in a file called "dictionary," which is loaded before compression and decompression. Through use of the dictionary, the compression ratio achievable on small data is improved. In addition to the training approach, Zstandard can also use user-defined pre-populated compression dictionaries.

Figure 12A:
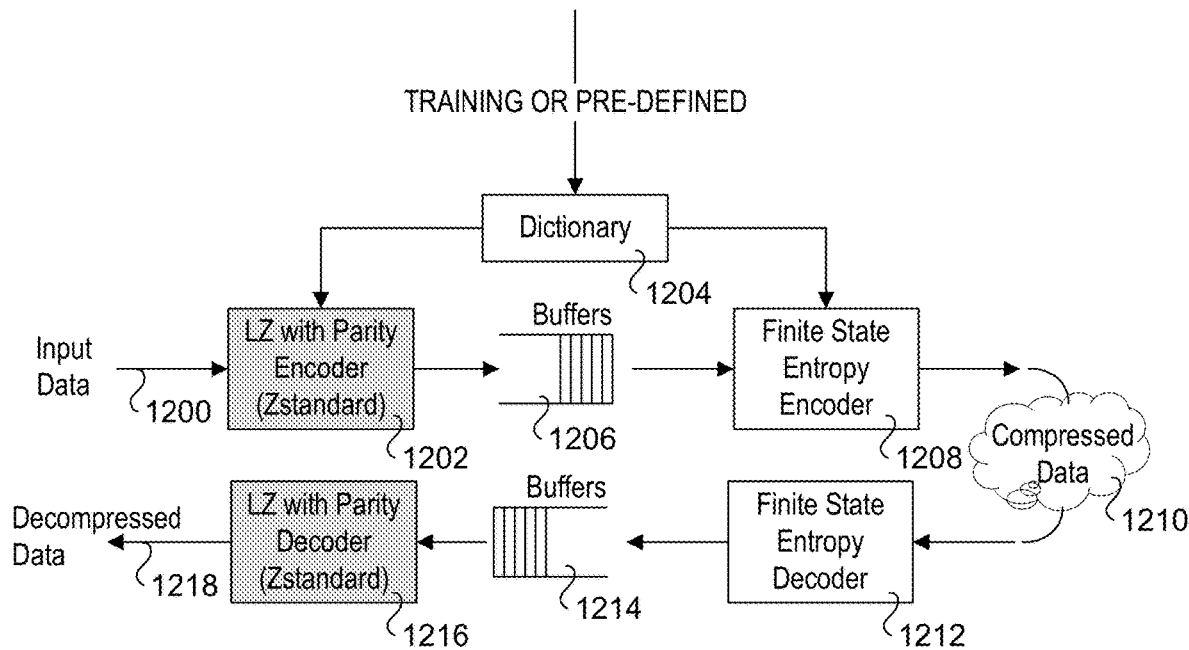
FIG. 12a is a diagram illustrating a modified Zstandard compression and decompression process flow using finite state entropy encoding that includes an LZ parity encoder and decoder in accordance with one or more embodiments herein.

FIGS. 12a-12d illustrate modified Zstandard compression/decompression processes including an LZ parity encoder in accordance with one or more embodiments herein. As shown in FIG. 12a, input data 1200 is received by an LZ with parity encoder 1202, which is configured to implement a window size >32 KB in accordance with the Zstandard LZ77 implementation discussed above. In the illustrated embodiments a dictionary 1204 is used; this dictionary can either be created using a training process or may be a user-defined pre-populated dictionary. In this simplified representation, the output of LZ with parity encoder 1202 is buffered in buffers 1206, and entropy-encoded using a finite state entropy encoder 1208, which also has access to dictionary 1204. Finite state entropy encoder 1208 output compressed data 1210, which may either be streamed or written to a Zstandard file.

In the example illustrated in FIG. 12a, the foregoing process is implemented on a first computing device or system, and compressed data 1210 is streamed to a second computing device or system that is configured to implement that decompression operations. This includes a finite state entropy decoder 1214, which outputs entropy-decoded data to buffers 1214, which are accessed by an LZ with parity decoder 1216, which again is configured to use the Zstandard LZ77 implementation. LZ with parity decoder 1216 outputs decompressed data 1218, which is the same as input data 1200.

Figure 12B:
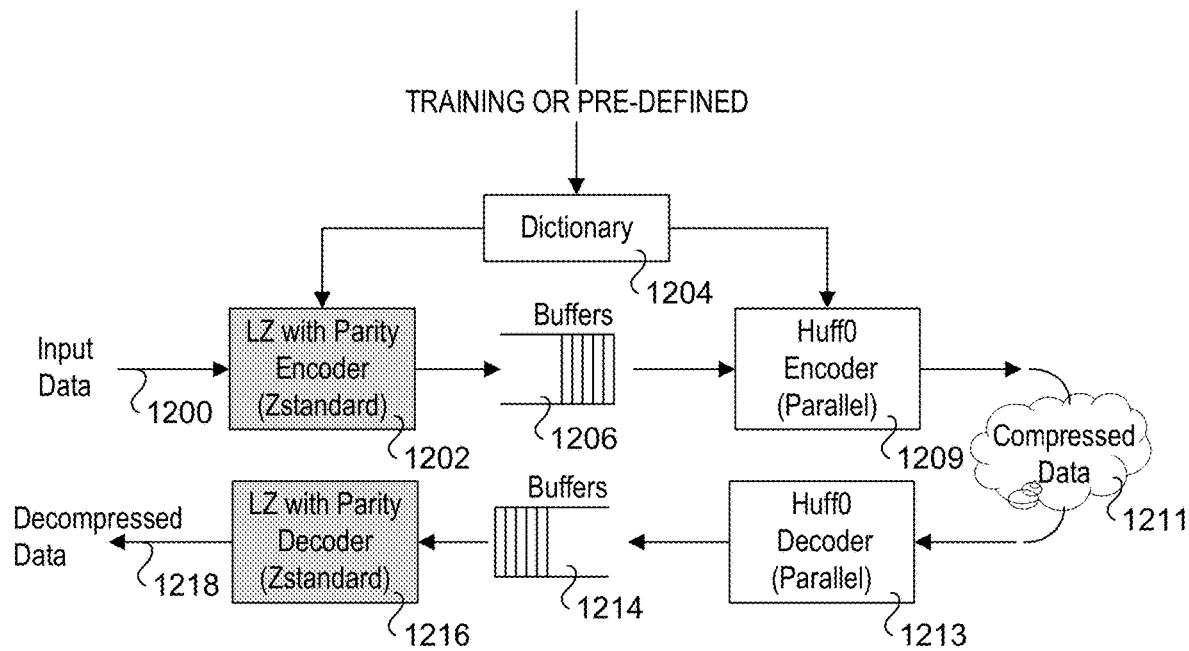
FIG. 12b is a diagram illustrating a modified Zstandard compression and decompression process flow using Huff0 entropy encoding that includes an LZ parity encoder and decoder in accordance with one or more embodiments herein.

The Zstandard compression/decompression process illustrated in FIG. 12b is similar to that shown in FIG. 12a, except the finite state encoder and decoder 1208 and 1212 are replaced with a Huff0 encoder 1209 and a Huff0 decoder 1213. Huff0 encoder outputs compressed data 1211, which may either be streamed or written to a Zstandard file. In one embodiment, each of the Huff0 encoder 1209 and Huff0 decoder 1213 are implemented in parallel using multiple ALUs.

Figure 12C:
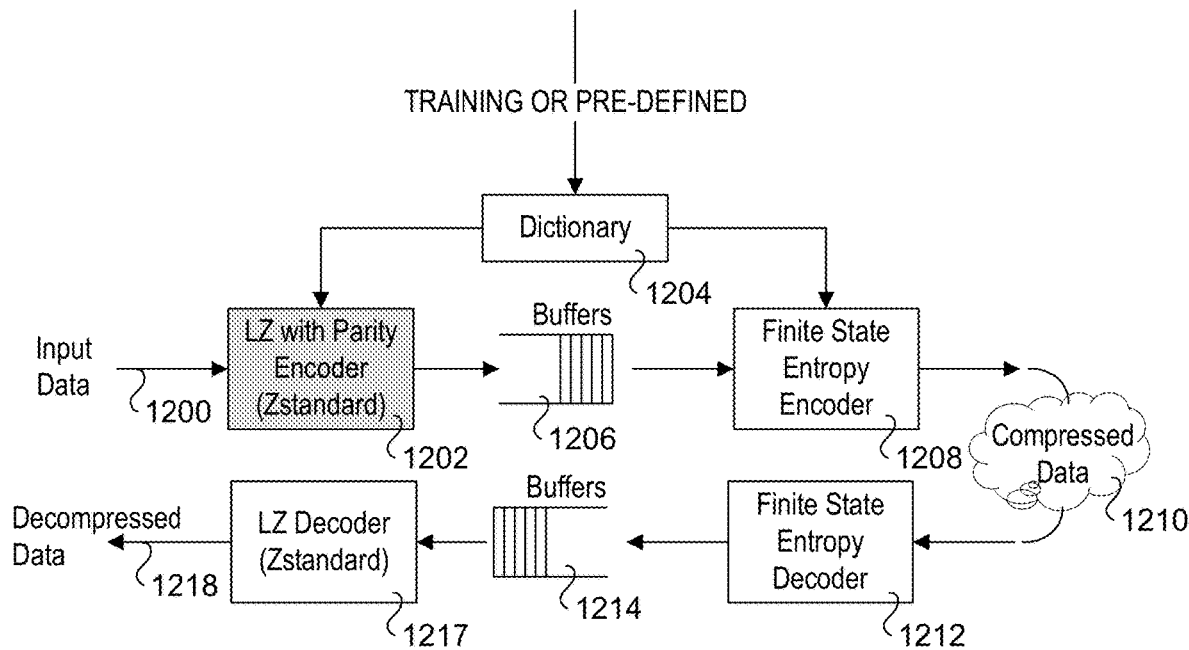
FIG. 12c is a diagram illustrating a modified Zstandard compression process flow using finite state entropy encoding that includes an LZ parity encoder in accordance with one or more embodiments herein and a conventional Zstandard decompression process.
Figure 12D:
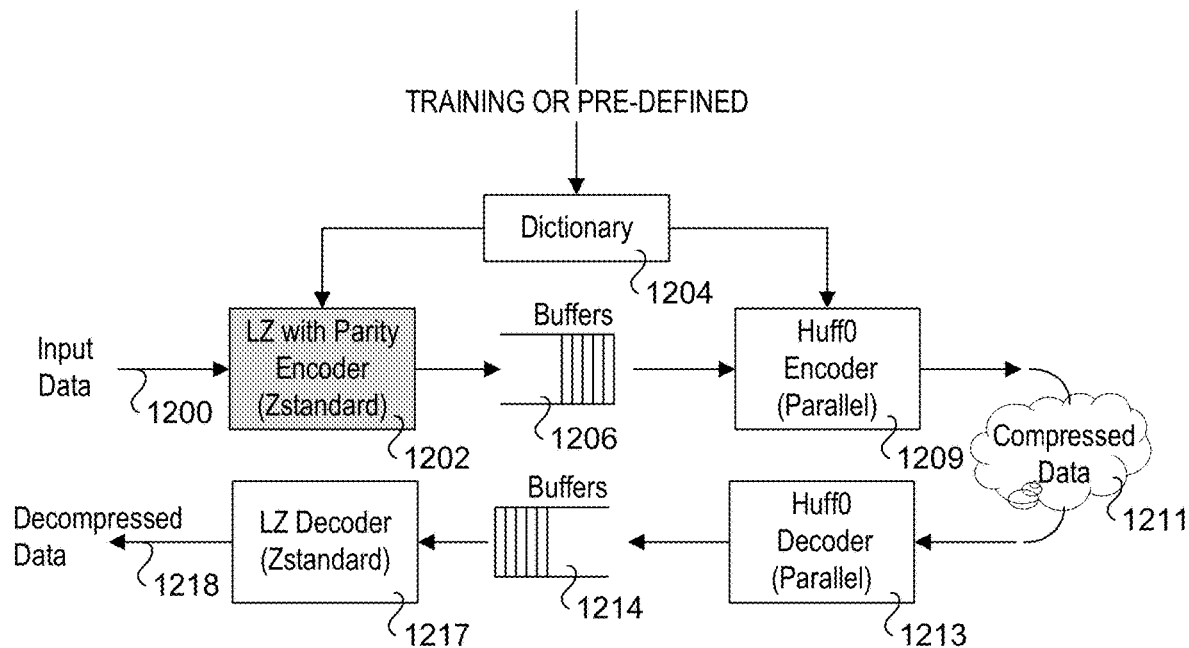
FIG. 12d is a diagram illustrating a modified Zstandard compression process flow using Huff0 entropy encoding that includes an LZ parity encoder in accordance with one or more embodiments herein and a conventional Zstandard decompression process.

As shown in FIGS. 12c and 12d, conventional Zstandard decompression processes may be used for computing devices and systems that are not configured to implement a modified Zstandard decompression process as illustrated in FIGS. 12a and 12b. For example, under these embodiments, the Zstandard implementation of the LZ with parity decoders are replaced with conventional Zstandard LZ decoders.

In addition to implementations using DEFLATE and Zstandard, the teachings and principles disclosed herein may be applied to other compression schemes employing an LZ-based encoders and decoders in a similar manner, including but not limited to Zlib, gzip, Brotli, Snappy, LZ4, LZO, LZS, and LZF.

Implementations Using Other Dictionary-Based Compression Schemes

The teaching and principles herein may be also implemented in other dictionary-based compression schemes (also called dictionary coders), such as but not limited to LZ78 and LZW compression schemes. Generally, the dictionary scheme used by LZ78 uses a somewhat similar scheme to the LZ77 compression scheme discussed above, except the dictionary structure is more explicit. At the beginning of the encoding process, the dictionary is empty. An index value of zero is used to represent the end of a string, so the first index of the dictionary is one. At each step of the encoding process, if there is no match, then the last matching index (or zero) and character are both added to the dictionary and output to the compressed stream. If there is a match, then the working index is updated to the matching index, and nothing is output.

LZW is similar to LZ78, but the dictionary is initialized to all possible symbols (symbols are single alphanumeric characters along with punctuation characters, white space characters, and the like). One common implementation works with 8-bit symbols, so the dictionary "codes" for hex 00 to hex FF (decimal 255) are pre-defined. Dictionary entries would be added starting with code value hex 100. Unlike LZ78, if a match is not found (or if the end of data), then only the dictionary code is output. Enhancements to LZW include handing symbol sizes other than 8 bits and having reserved codes to reset the dictionary and to indicate end of data.

Under one exemplary implementation, the token for a dictionary match is <len, index>, where len is the length of the match and index is the index in the dictionary. The parity value (0 or 1) can be determined as a function of <len, index> in a manner similar to that described above for <len, distance>, such as using (len+index)mod 2. If the parity determined using (len+index)mod 2 does not match the current parity value (e.g., cumulative parity at pos or a predetermined value), len is decremented and a new parity match value based on ((new)len+index)mod 2 is calculated. This scheme may be repeated until the parity values match.

Checking parity values during decoding is similar to that described above. As the data is decompressed, symbols are added to the output (decompressed) byte stream using the applicable dictionary decoding scheme, enabling the parity at the current pos to be determined. For positions for which parity is checked, that calculated parity value (or a predetermined parity value if a predetermined parity scheme is used) is then compared with the parity value calculated using the parity function used during encoding, e.g., (len+index)mod 2. As before, various parity check schemes may be implemented, including but not limited to every Nth token or using a minimum BSKIP scheme.

Exemplary Implementation Systems

Figure 13A:
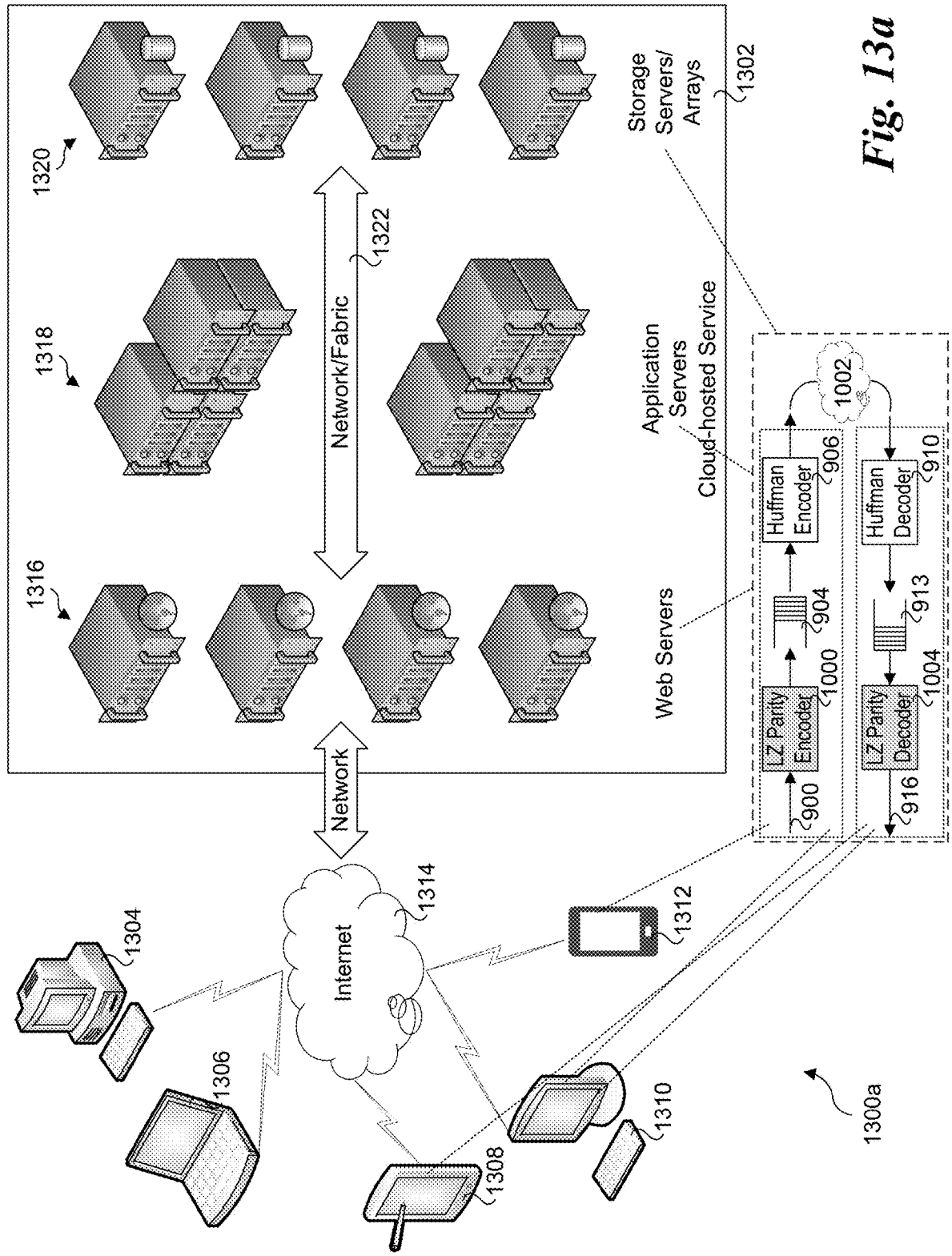
FIG. 13a is schematic diagram illustrating an exemplary implementation system including a cloud-hosted service the serves various clients via the Internet and under which embodiments of the parity-encoded DEFLATE compression and decompression schemes may be implemented.

FIG. 13a shows an implementation system 1300a including a cloud-hosted service 1302 that provides data storage services to various clients 1304, 1306, 1308, 1310, and 1312 via the Internet 1314. In this illustrated example, cloud-hosted service 1302 employs a 3-tier architecture comprising a "front-end" Web server tier including a plurality of Web servers 1316, and application server tier including a plurality of application servers 1318, and a "back-end" or storage tier including a plurality of storage servers and/or storage arrays 1320. The various servers and storage components employed by cloud-hosted service 1302 are coupled in communication via one or more networks and or fabrics, collectively depicted as network/fabric 1322 for simplicity. Generally, in some implementations or uses, Web servers 1316 may communicate directly with storage servers/arrays 1302, while in other implementations the communication paths between the Web server tier and the storage tier includes application servers 1318.

Under some embodiments, the servers and other components depicted in FIG. 13a are installed in a data center or the like. In addition to the components shown, the data center may have other components such as load balancers, and various networking equipment, such as top-of-rack (TOR) switches, as well as management components typically employed in data centers. Details of a blade server architecture that may be used for servers in one or more of the tiers are discussed below with reference to FIGS. 14a-c and 15. Under other embodiments, a cloud-hosted service may lease equipment from companies such as Amazon (Amazon Web Services or AWS), Microsoft (Microsoft Cloud or Microsoft Azure), Google (Google Cloud), and others.

Web servers 1316 are configured to provide communication with clients 1304, 1306, 1308, 1310, and 1312 via Internet 1314. This will usually be facilitated using a conventional networking stack such as HTTP or HTTPS over TCP/IP, under which file transfers may employ a streaming connection or may employ a chunk-based transfer mechanism. In some embodiments, Web servers 1316 will be configured to implement a Web service using a RESTful interface with JSON and/or XML, while other types of Web service interfaces, such as SOAP, may also used.

As their name implies, application servers 1318 are used to host applications. Under a cloud-hosted storage service, an application may be employed for accessing data that is stored in storage devices in the storage tier. In addition, application servers 1318 may be employed to perform storage replication under which copies of data are stored in data centers at separate geographic locations. Application servers may also include database servers or may support various other types of data architecture schemes. Depending on the required scale, some cloud-hosted services may implement application server functions in the Web servers and/or the storage servers (employing a 2-tier architecture), while other services may employ a 3-tier architecture. 4-tier architectures (not shown) may also be implemented.

The networks and fabrics within a data center are private. They can implement various protocols, including standardized protocols such as TCP/IP, as well as proprietary protocols. Moreover, streaming between tiers within a data center may be implemented with or without HTTP/HTTPS. In addition, since the servers and application software is managed by the cloud-hosted service provider, the software can be configured to support parity-encoded compression decompression for transfers within the data center using pre-determined schemes that do not involve including what parity scheme to use in the headers of the files. At the same time, including the parity information in file headers may also be used.

Communication between Web servers 1316 and clients 1304, 1306, 1308, 1310, and 1312 may use conventional compression/decompression such as conventional DEFLATE software or may use one or more of the parity-encoded compression/decompression schemes disclosed herein. For example, storage services such as DropBox, Microsoft OneDrive, Google Drive, Box, etc., all include client applications that run on clients to facilitate communication between client devices running the client applications and storage services hosted in one or more data centers. As illustrated, some clients may support both parity-encoded compression and decompression, while some other client may support only parity-encoded compression or decompression, while other clients may not support either and rely on conventional compression and decompression.

In view of the foregoing, various implementations of the parity-encoded compression/decompression schemes may be used, including but not limited to some of the following examples. In important aspect of the embodiments disclosed herein is the parity information is implicitly encoded or "hidden" in a manner under which parity bits are not explicitly added to the encoded streams and or compressed files. As a result, conventional decompression software may be used, as such software is agnostic to the hidden parity information. Accordingly, under an embodiment employing conventional compression/decompression for a client, a file may be stored in a format such as gzip or PKZIP on a storage device in the cloud-hosted server under which the file was created using a parity-encoded compression scheme. For transfer of that file within the cloud-hosted service, such as between the storage tier and the application server tier, between the application server tier and the Web server tier, or between the storage tier and the Web server tier, a decompressor configured to implement parity checks of the parity-encoded gzip or PKZIP file may be employed. Meanwhile, file contents that are encoded using one of the parity-encoding schemes may be streamed from a Web server 1316 to one of clients 1304, 1306, 1308, 1310, and 1312 and decompressed/decoded without any modification to the conventional gzip or PKZIP (or any other file format implementing conventional DEFLATE) decompressor on the client. As discussed above, the clients may support (via software running on the clients) parity-encoded compression and/or decompression schemes, either using pre-known parity-encoding schemes or using parity scheme information included in the file headers (or included in a first portion of the streamed content).

Figure 13B:
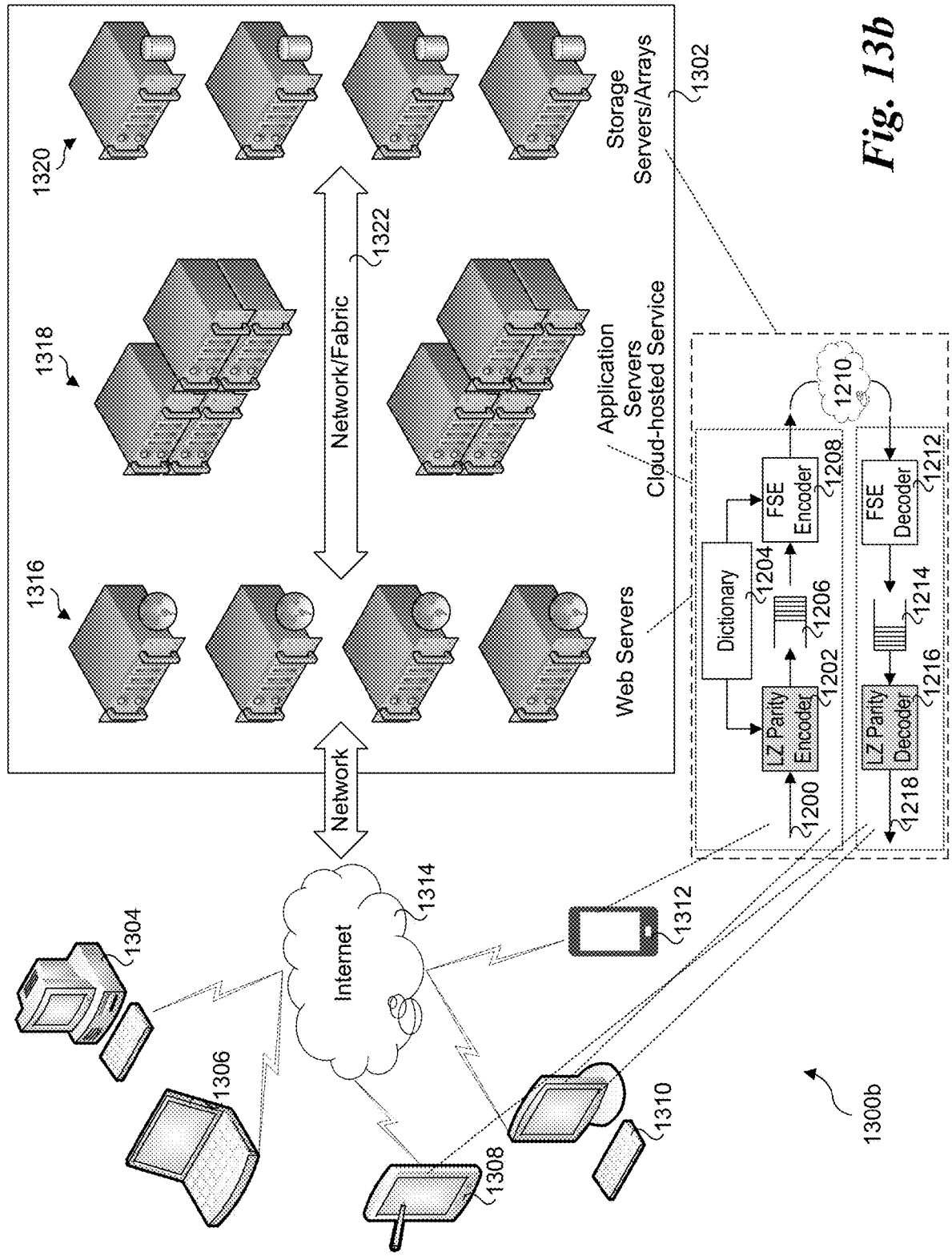
FIG. 13b is schematic diagram illustrating an exemplary implementation system including a cloud-hosted service the serves various clients via the Internet and under which embodiments of the parity-encoded Zstandard compression and decompression schemes may be implemented.

FIG. 13b shows an implementation system 1300b that is similar to implementation system 1300a, except implementation system 1300b employs a modified with parity Zstandard scheme that is modified to support parity encoding rather than the modified DEFLATE scheme shown in implementation system 1300a. In addition to using compression/decompression components of FIG. 13a including a finite state entropy (FSE) encoder 1208 and FSE decoder 1212, the compression decompression components of FIG. 12b including Huff0 encoder 1209 and Huff0 decoder 1213 may be implemented in a similar manner. As with implementation system 1300a, some computing systems and devices may employ one or more of the parity-encoded Zstandard compression process and parity-encoded Zstandard decompression processes.

Generally, it is envisioned that aspects of the embodiments herein may be implemented in various types of computing equipment and devices, such as blade servers and other types of servers employed in a data center and/or server farm environment. Typically, the servers used in data centers and server farms comprise arrayed server configurations such as rack-based servers or blade servers. These servers are interconnected in communication via various network provisions, such as partitioning sets of servers into LANs with appropriate switching and routing facilities between the LANs to form a private Intranet. For example, cloud-hosting facilities may typically employ large data centers with a multitude of racks filed with various configurations of servers.

As an overview, exemplary blade server components and systems are shown in FIGS. 14a-c, and 15. Under one configuration, a rack-mounted chassis 1400 is employed to provide power and communication functions for a plurality of server blades (e.g., blades) 1402, each of which occupies a corresponding slot in the chassis. (It is noted that all slots in a chassis do not need to be occupied.) In turn, one or more chassis 1400 may be installed in a blade server rack 1403 shown in FIG. 14c. Each blade is coupled to an interface plane 1404 (e.g., a backplane or mid-plane) upon installation via one or more mating connectors. Generally, the interface plane may include a plurality of respective mating connectors that provide power and communication signals to the blades, and including routed signal paths for coupling network signals or fabric signals between blades. Under current practices, many interface planes provide "hot-swapping" functionality—that is, blades can be added or removed ("hot-swapped") on the fly, without taking the entire chassis down through appropriate power and data signal buffering.

Figure 14A:
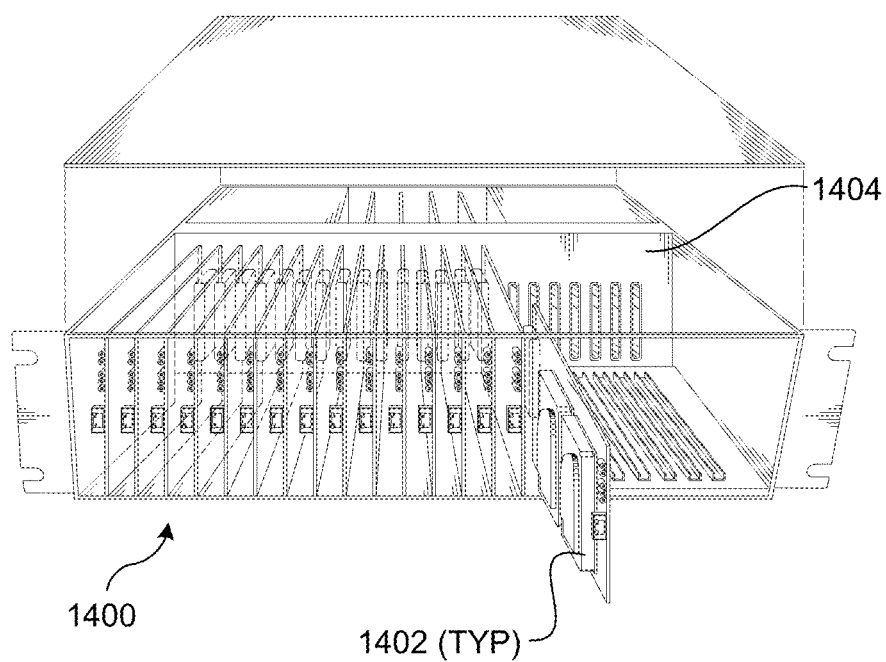
FIG. 14a is a frontal isometric view of an exemplary blade server chassis in which a plurality of server blades are installed.
Figure 14B:
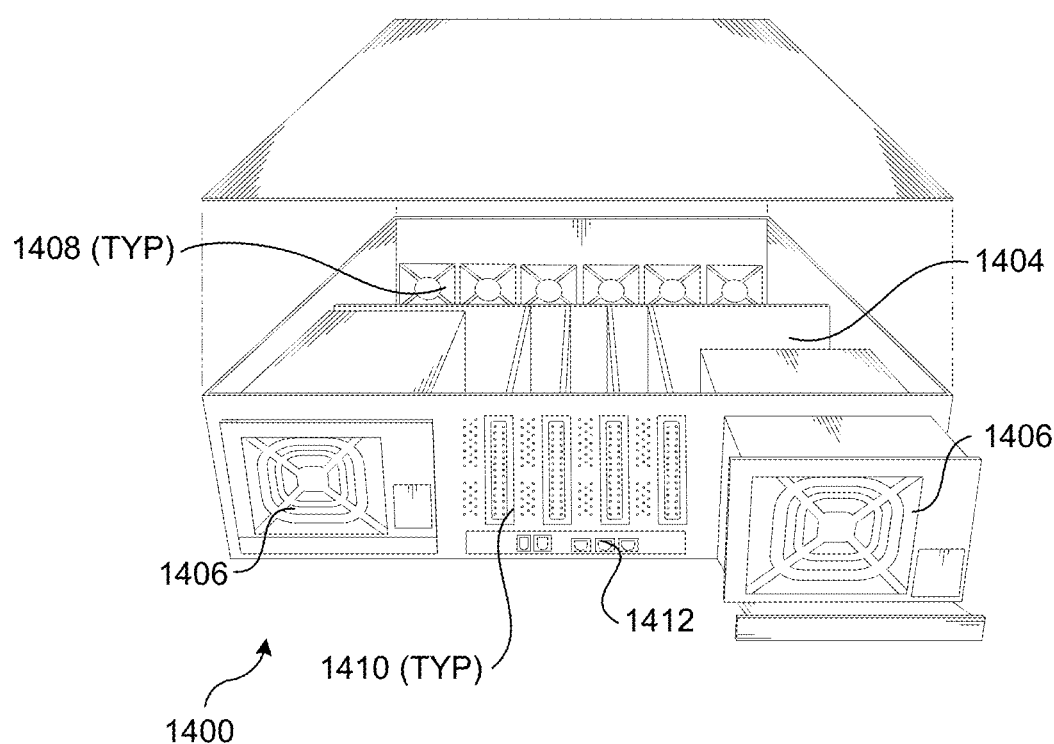
Figure 14C:
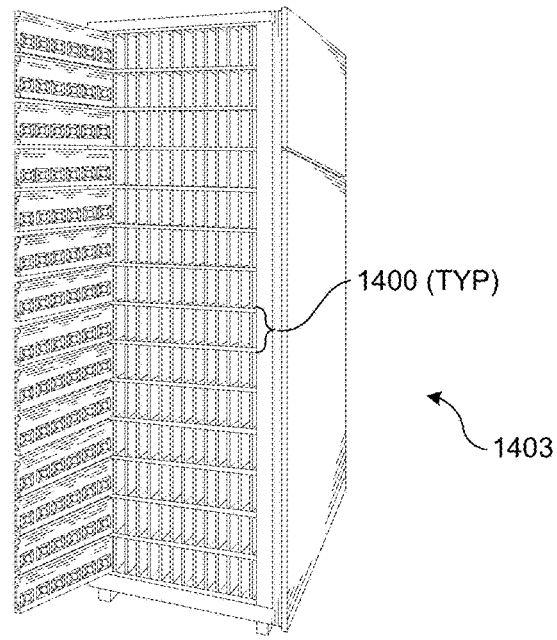
FIG. 14c is an isometric frontal view of an exemplary blade server rack in which a plurality of rack-mounted blade server chassis corresponding to FIGS. 16a and 16b are installed.

An exemplary mid-plane interface plane configuration is shown in FIGS. 14a and 14b. The backside of interface plane 1404 is coupled to one or more power supplies 1406. Oftentimes, the power supplies are redundant and hot-swappable, being coupled to appropriate power planes and conditioning circuitry to enable continued operation in the event of a power supply failure. In an optional configuration, an array of power supplies may be used to supply power to an entire rack of blades, wherein there is not a one-to-one power supply-to-chassis correspondence. A plurality of cooling fans 1408 are employed to draw air through the chassis to cool the server blades.

Blade servers generally include the ability to communicate externally with other IT infrastructure, either via communication functionality on the blade server itself or through communication via the midplane or backplane with another card installed in the chassis. For example, this may be facilitated via one or more network connect cards 1410, each of which is coupled to interface plane 1404. Generally, a network connect card may include a physical interface comprising a plurality of network port connections (e.g., RJ-45 ports for wired Ethernet, a SFP or SFP+port for an optical link, a silicon photonics port, etc.), or may comprise a high-density connector designed to directly connect to a network device, such as a network switch, hub, or router. Under recently introduced disaggregated architectures, such as employed by INTEL® Rack Space Design architecture, other types of communication may be provided, such as communication over proprietary fabrics and PCI Express. Systems implementing Open Compute components and architectures may also be used.

Blade servers may provide some type of management interface for managing operations of the individual blades. This may generally be facilitated by a built-in network or communication channel or channels. For example, one or more buses for facilitating a "private" or "management" network and appropriate switching may be built into the interface plane, or a private network may be implemented through closely-coupled network cabling and a network. Optionally, the switching and other management functionality may be provided by a management switch card 1412 that is coupled to the backside or frontside of the interface plane. As yet another option, a management or configuration server may be employed to manage blade activities, wherein communications are handled via standard computer networking infrastructure, for example, Ethernet or an optical network.

Figure 15:
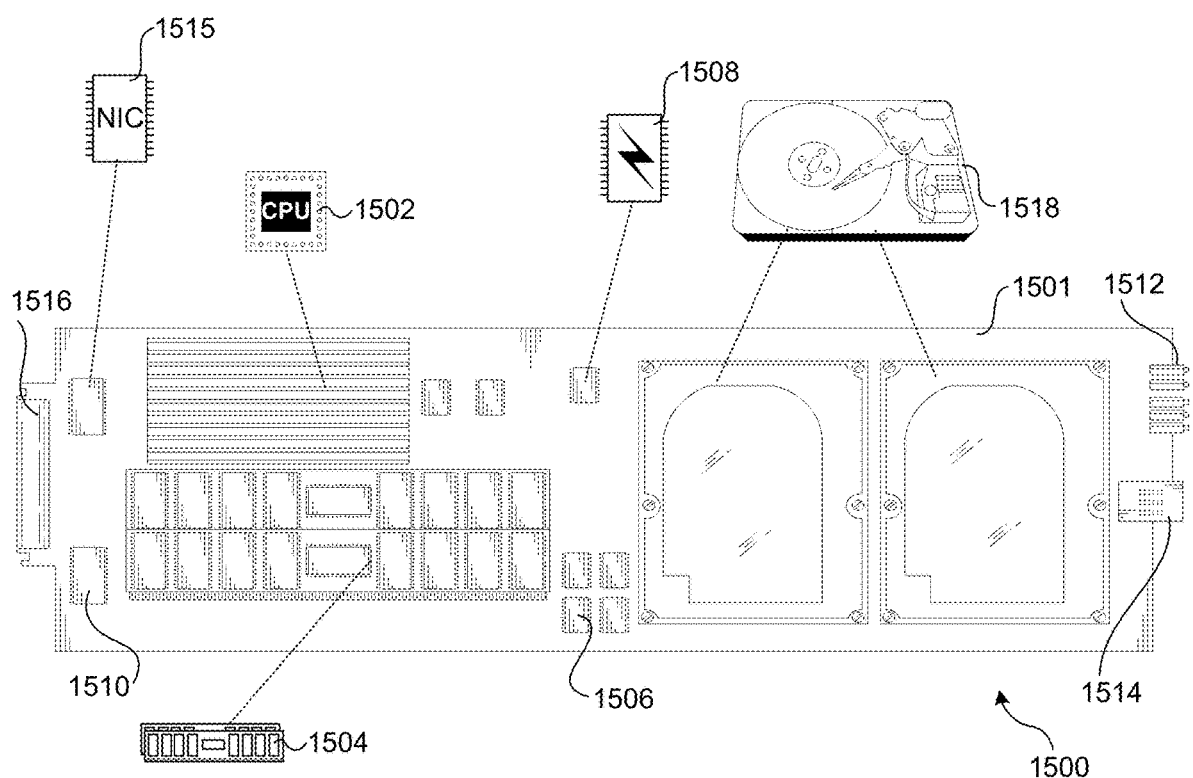
FIG. 15 shows details of the components of a typical server blade, according to one embodiment.

With reference to FIG. 15, further details of an exemplary blade 1500 are shown. Each blade comprises a separate computing platform that is configured to perform server-type functions, e.g., is a "server on a card." Accordingly, each blade includes components common to conventional servers, including a main printed circuit board (main board) 1501 providing internal wiring (e.g., buses) for coupling appropriate integrated circuits (ICs) and other components mounted to the board. These components include one or more processors 1502 coupled to system memory 1504 (e.g., some form of Random Access Memory (RAM)), one or more accelerators 1506 (optional), and a firmware storage device 1508 (e.g., flash memory). A NIC (network interface controller) chip 1510 is provided for supporting conventional network communication functions, such as to support communication between a blade and external network infrastructure. Other illustrated components include status LED (light-emitting diodes) 1512, a set of RJ-45 console ports 1514 (only one of which is shown for simplicity), and a NIC 1515 coupled to an interface plane connector 1516. Additional components include various passive components (e.g., resistors, capacitors), power conditioning components, and peripheral device connectors. Other types of NICs and ports may also be used, such as SPF or SPF+ports.

Some blades may also provide on-board storage. This is generally facilitated via one or more built-in disk controllers and corresponding connectors to which one or more disk drives 1518 are coupled. For example, common disk controllers include SATA controllers, SCSI controllers, and the like. Other types of disk controllers may also be used. Additionally, solid state drive (SSD) may be used in place of disk drive 1518. As an option, the disk drives may be housed separate from the blades in the same or a separate rack, such as might be the case when a network-attached storage (NAS) appliance or backend storage sub-system that is employed for storing large volumes of data. Under an implementation employing INTEL® Rack Space Design architecture, storage devices may be installed in pooled storage drawers that are separate from pooled compute drawers in which server blades or server modules are installed.

Generally, a client device may include any type of computing device or system that is configured to communicate over a network and run suitable compression/decompression software. Such computing devices include but are not limited to laptops, notebooks, desktop computers, workstations, mobile phones, tablets, etc.

Figure 16:
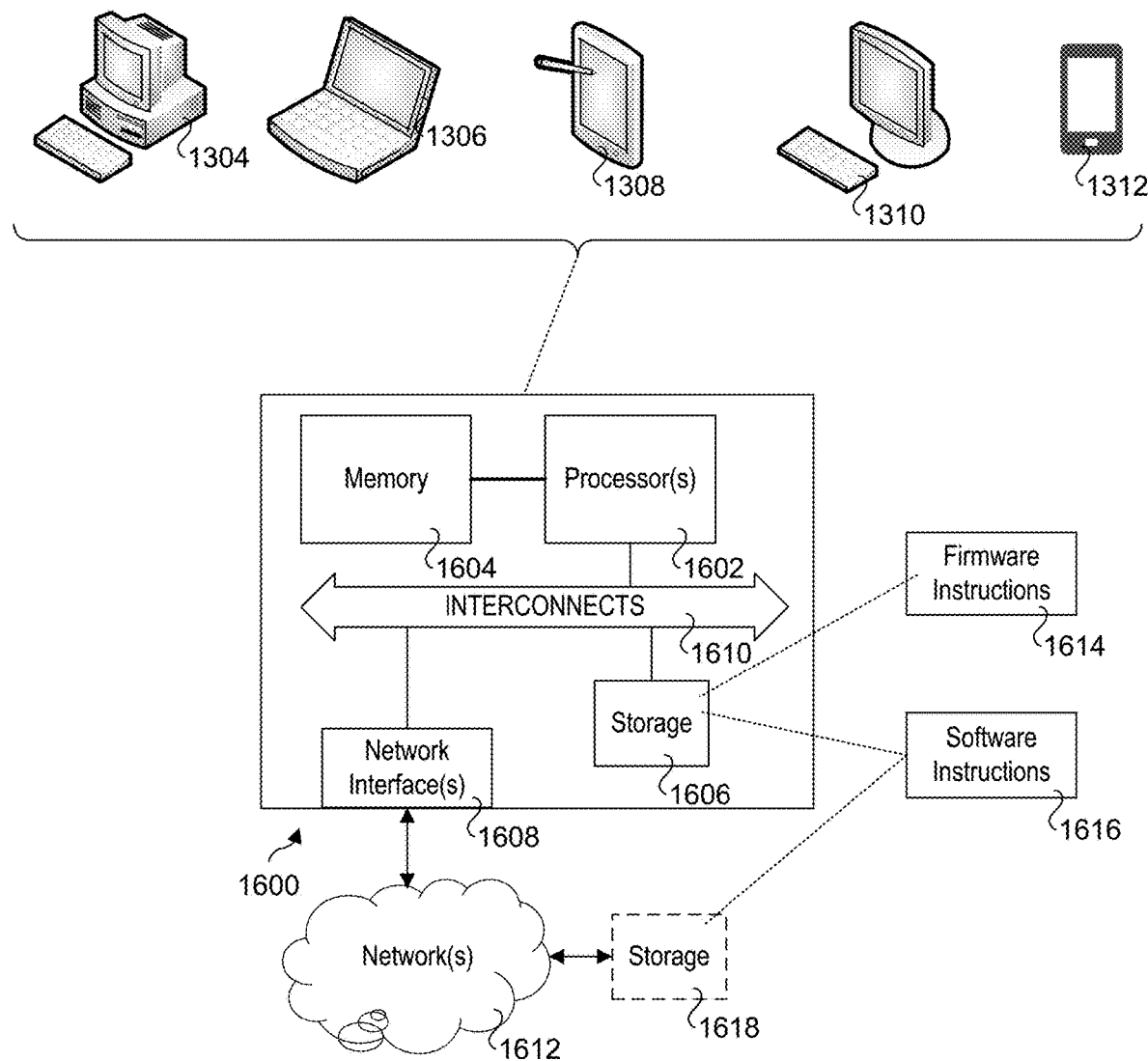
FIG. 16 is a diagram illustrating generalized platform hardware implemented in various types of clients shown in FIG. 13.

FIG. 16 shows an abstracted platform architecture 1600 including some basic components found in each of clients 1304 (desktop computer/workstation), 1306 (laptop or notebook), 1308 (tablet), 1310 (all-in-one computer, such as an iMac), and 1312 (mobile phone). As illustrated, each of these computing device/systems includes one or more processors 1602, memory 1604, one or more storage devices 1606, and one or more network interfaces 1608. These components, as well as other components that are not shown are interconnected via various interconnect circuitry, which is depicted as interconnects 1610 for simplicity.

Generally, processor(s) 1602 may include a single-core or multi-core processor having various types of architecture. Some processors may employ a System on a Chip (SoC) architecture including various built-in interfaces and supporting various functions. A processor may include an integrated Graphics Processing Unit (GPU), or the platform hardware may include a GPU that is separate from the processor (as well as no GPU).

Network interface(s) may include one or more of wired and wireless interfaces that support communication over one or more networks 1612. For example, desktops, laptops, notebooks, and all-in-one computers may include Ethernet interfaces or adaptors, as well as an IEEE 802.11-based wireless (Wi-Fi) interface. Tablets and mobile phones may include mobile radios to support communication over mobile networks, as well as Wi-Fi interfaces.

Platform firmware instructions 1614 will generally be stored in some form of non-volatile storage device 1606, such as a Flash memory device, while software instructions 1616 may be stored in an on-board storage device and/or may be stored somewhere on a network storage device 1618 and loaded over a network. For example, software instructions, including an operating system may be stored on in a disk drive (magnetic or SSD) for desktops, laptops, notebooks, and all-in-one computers, while operating system and application software will be stored in Flash memory or the like for mobile phones and tables. The software instructions may be loaded from storage into memory 1604 and executed on the one or more processors 1602 to effect various operations, including the compression and decompression schemes described and illustrated herein. Generally, software instructions may be directly executed on a processor or executed on a virtual machine that is hosted by the computing device or system.

Figure 17:
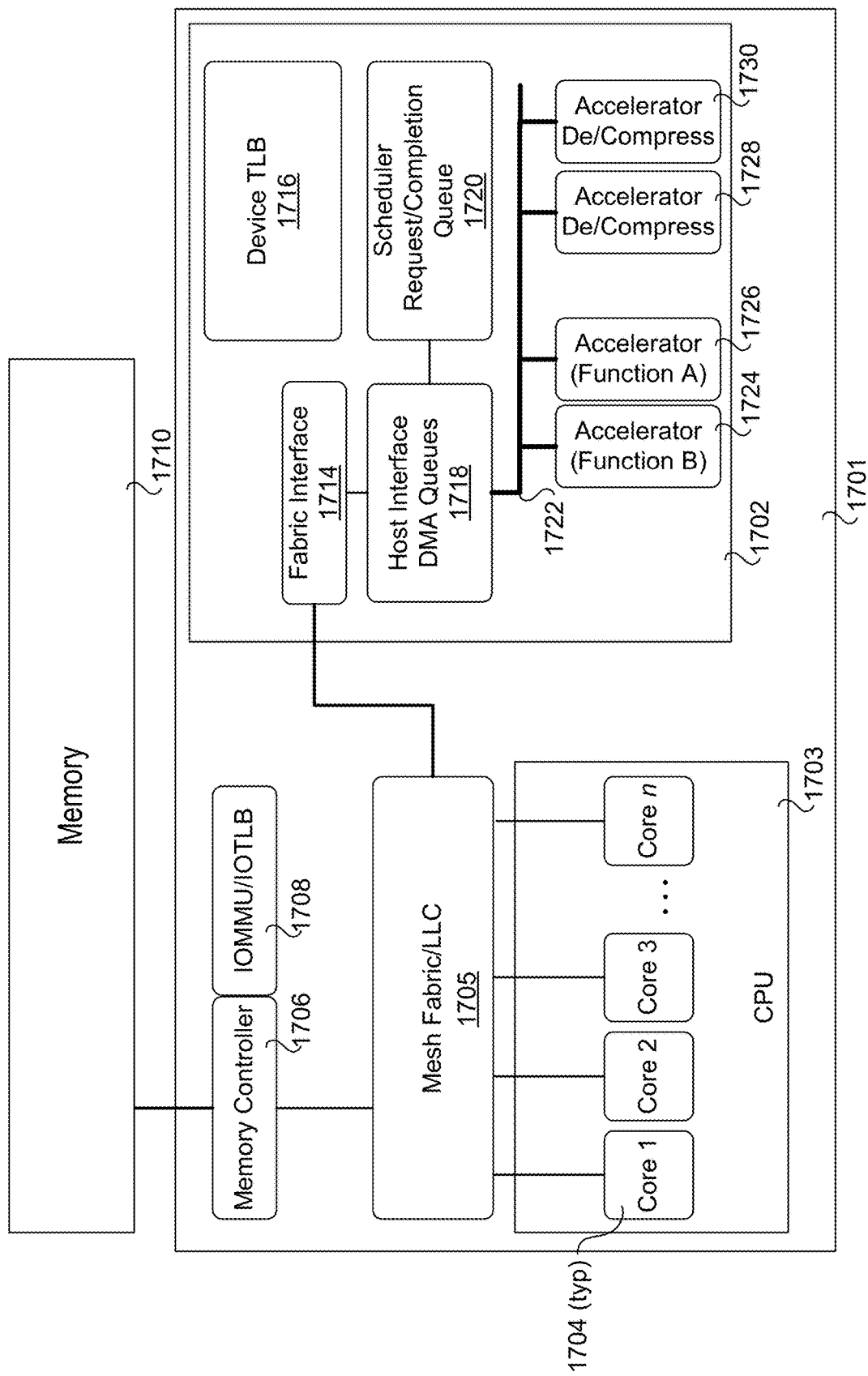
FIG. 17 is a schematic diagram of a platform architecture including a processor having an on-chip accelerator configured to implement parity-encoded compression and decompression operations in accordance with one or more embodiments disclosed herein.

FIG. 17 shows a platform architecture 1700 including a processor 1701 having an on-chip accelerator 1702 (also referred to as an accelerator complex when the accelerator supports multiple instances of accelerator functions). Processor 1701 includes a Central Processing Unit (CPU) 1703 including n cores 1704, each with a private L1 and L2 cache (not shown). Each of cores 1704 is connected to a mesh fabric/LLC (last-level cache) block 1705, which is coupled to a memory controller 1706 with an associated Input-Output Memory Management Unit and Input-Output Translation Lookaside Buffer (IOMMU/IOTLB) 1708. Memory controller 1706 is coupled to memory 1710, which is illustrative of one or more DRAM memory devices, such as DDR4 DIMMS. Memory 1710 may also be implemented using one or more Non-Volatile DIMMs (NVDIMMs). Generally, Memory controller 1706 would be coupled to the DRAM memory devices with one or more memory channels per DRAM memory device (not shown).

FIG. 17 further shows an embodiment of an on-chip accelerator 1712, which is representative of various types of accelerators. On-chip accelerator 1712 includes a fabric interface 1714, a device TLB 1716, host interface DMA queues 1718, a scheduler request/completion queue 1720, and a bus 1722 to which multiple accelerators are coupled as depicted by accelerators 1724, 1726, 1728, and 1730. Fabric interface 1714 is generally illustrative of various types of IO interfaces that can connect an on-chip accelerator to the interconnect infrastructure on the processor/SoC, as collectively illustrated and described herein as a mesh fabric. The interconnect structure and protocol may generally include both proprietary and standards-based interconnects.

Accelerators are generally used to off-load CPU intensive tasks from a processor's cores, such as compression and decompression functions, which are math-intensive. In the embodiments herein, some or all of the accelerators may be further configured to generate a decryption key and used the decryption key for performing decryption and (optional) encryption operations. For illustrative purposes, accelerators

1724 and 1726 are depicted as being configured to perform the respective functions A and B, such as but not limited to encryption and decryption. Meanwhile, accelerators 1728 and 1730 are depicted as performing compression and/or decompression operations with parity encoding in accordance with one or more embodiments described herein.

Generally, an accelerator may include embedded circuitry and logic that is tailored to efficiently perform one or more specialized tasks, such as the parity-encoded compression and decompression functions described and illustrated herein. The circuitry may be in the form of an ASIC (application-specific integrated circuit), or may include programmable circuitry/logic, such as provided via an FPGA. Such an FPGA may comprise one or more FPGA blocks, such as are available via license from various manufacturers. An FPGA block may also incorporate a custom design. Generally, the ASIC, FPGA block, or similar embedded circuitry and logic is referred to herein as a functional unit, which is designed to perform a corresponding function. A given accelerator may include one or more functional units.

More generally, an accelerator may also be referred to as an "engine," wherein the engine may be programmed to perform one or more dedicated functions. In some embodiments, an engine may operate in a similar manner to an embedded processor, and be enabled to execute instructions (e.g., accelerator application/function instructions) for dedicated functions. An engine may also combine both execution of instructions in combination with embedded circuitry and logic.

Accelerators have steadily improved in capability with one of the most significant recent trends being "shared virtual memory" (SVM)-capable accelerators. The traditional accelerator needed to be managed as an IO device in its own personal address space; this was accomplished with expensive kernel-mode drivers (KMD) that needed applications to cross back and forth between user and kernel-space, pinning pages in memory or copying user buffers to/from special buffers managed by the OS/Kernel-mode-driver. With SVM, the accelerator or IO device can directly work on the address space of user application thread running on a CPU, as it shares the same virtual->physical address translation capabilities as the user application thread. This is a key improvement in accelerator efficiency (from the point of view of data movement), enables user-mode submissions directly to the accelerators (via a "user-mode-driver" or UMD) and results in easier programming models and adoption. In one embodiment, platform architecture 1700 is configured to implement SVM-capable accelerators.

Aspect of the foregoing encoding schemes may also be extended to support multi-bit parity. For instance, the first reference, a first bit-lane parity would be encoded, for the second reference a second bit-lane parity would be encoded, and so on until the eight reference (for which an eighth bit lane parity would be encoded), at which point the parity-bit to be encoded would return to the first parity lane, with the process being repeated through the eight parity lanes. More generally, this approach could be applied to a multi-bit parity scheme employing two or more parity-bit lanes.

Although some embodiments have been described in reference to particular implementations, other implementations are possible according to some embodiments. Additionally, the arrangement and/or order of elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. Additionally, "communicatively coupled" means that two or more elements that may or may not be in direct contact with each other, are enabled to communicate with each other. For example, if component A is connected to component B, which in turn is connected to component C, component A may be communicatively coupled to component C using component B as an intermediary component.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Letters, such as 'n' and 'N' in the foregoing detailed description are used to depict an integer number, and the use of a particular letter is not limited to particular embodiments. Moreover, the same letter may be used in separate claims to represent separate integer numbers, or different letters may be used. In addition, use of a particular letter in the detailed description may or may not match the letter used in a claim that pertains to the same subject matter in the detailed description.

As discussed above, various aspects of the embodiments herein may be facilitated by corresponding software and/or firmware components and applications, such as software and/or firmware executed by an embedded processor or the like. Thus, embodiments of this invention may be used as or to support a software program, software modules, firmware, and/or distributed software executed upon some form of processor, processing core or embedded logic a virtual machine running on a processor or core or otherwise implemented or realized upon or within a non-transitory computer-readable or machine-readable storage medium. A non-transitory computer-readable or machine-readable storage medium includes any mechanism for storing or transmitting information in a form readable by a machine (e.g., a computer). For example, a non-transitory computer-readable or machine-readable storage medium includes any mechanism that provides (e.g., stores and/or transmits) information in a form accessible by a computer or computing machine (e.g., computing device, electronic system, etc.), such as recordable/non-recordable media (e.g., read only memory (ROM), random access memory (RAM), magnetic disk storage media, optical storage media, flash memory devices, etc.). The content may be directly executable ("object" or "executable" form), source code, or difference code ("delta" or "patch" code). A non-transitory computer-readable or machine-readable storage medium may also include a storage or database from which content can be downloaded. The non-transitory computer-readable or machine-readable storage medium may also include a device or product having content stored thereon at a time of sale or delivery. Thus, delivering a device with stored content, or offering content for download over a communication medium may be understood as providing an article of manufacture comprising a non-transitory computer-readable or machine-readable storage medium with such content described herein.

Various components referred to above as processes, servers, or tools described herein may be a means for performing the functions described. The operations and functions performed by various components described herein may be implemented by software running on a processing element, via embedded hardware or the like, or any combination of hardware and software. Such components may be implemented as software modules, hardware modules, special-purpose hardware (e.g., application specific hardware, ASICs, DSPs, etc.), embedded controllers, hardwired circuitry, hardware logic, etc. Software content (e.g., data, instructions, configuration information, etc.) may be provided via an article of manufacture including non-transitory computer-readable or machine-readable storage medium, which provides content that represents instructions that can be executed. The content may result in a computer performing various functions/operations described herein.

As used herein, a list of items joined by the term "at least one of" can mean any combination of the listed terms. For example, the phrase "at least one of A, B or C" can mean A; B; C; A and B; A and C; B and C; or A, B and C.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A method comprising:
   at a first computing device or system,
   encoding a byte stream to generate a plurality of tokens;
   encoding at least a portion of the plurality of tokens with hidden parity information; and
   generating, using the plurality of tokens, a compressed byte stream;
   at a second computing device or system,
   receiving the compressed byte stream and decompressing the compressed byte stream to produce decompressed data; and
   as the compressed byte stream is being decompressed, decoding the hidden parity information encoded in the at least a portion of the plurality of tokens and using the parity information that is decoded to detect for errors in the decompressed data.

2. The method of claim 1, further comprising:
   at the first computing device or system,
   encoding the byte stream using a Lempel-Ziv 77 (LZ77)-based encoding process to generate a sequence of tokens comprising the plurality of tokens including a plurality of literals and a plurality of references, each reference identifying a length of a block of characters in the byte stream that match an earlier instance of the block of characters in the byte stream and a distance to the earlier instance of the block of characters; and
   encoding at least a portion of the references with hidden parity information;
   at the second computing device or system,
   as the compressed byte stream is being decompressed, decoding the hidden parity information encoded in the at least a portion of the references and using the parity information that is decoded to detect for errors in the decompressed data.

3. The method of claim 2, wherein the compressed byte stream has a format compliant with a Deflate format and is configured to be decoded by a standard Deflate decoder without decoding the hidden parity information.

4. The method of claim 2, wherein the compressed byte stream has a format compliant with a Zstandard format and is configured to be decoded by a standard Zstandard decoder without decoding the hidden parity information.

5. The method of claim 2, wherein a reference is encoded with hidden parity information by performing operations comprising:
   determining a first parity value to be matched;
   identifying, beginning at a current position in the byte stream, a block of characters having a first length and matching a first prior block of characters in the byte stream at a first distance;
   determining a second parity value to be matched as a function of the first length and first distance;
   when the first and second parity values match, generating a reference with the first length and the first distance; otherwise,
   when the first and second parity values do not match, identifying a second matching block of characters in the byte stream having one of the first length or a second length and at a second distance;
   determining a third parity value to be matched as a function of the first length and the second distance or second length and the second distance; and
   when the first and third parity values match, generating a reference with the first length and second distance or second length and the second distance.

6. The method of claim 5, further comprising:
   when the first and second parity values do not match, decrementing the first length by 1 to produce a second length;

identifying a second prior matching block of characters in the byte stream having the second length and being located at a second distance;
determining the third parity value as a function of the second length and the second distance; and
when the first and third parity values match, generating a reference with the second length and the second distance.

7. The method of claim 5, further comprising:
when the first and second parity values do not match,
identifying a second prior matching block of characters in the byte stream having the first length and being located at a second distance;
determining the third parity value as a function of the first length and the second distance; and
when the first and third parity values match, generating a reference with the first length and the second distance;
when the first and third parity values do not match, identifying a third prior matching block of characters in the byte stream having the first length and being located at a third distance;
determining a fourth parity value as a function of the first length and the third distance; and
when the first and fourth parity values match, generating a reference with the first length and the third distance.

8. The method of claim 5, further comprising:
determining a cumulative parity as a function of the current position in the byte stream; and
using the cumulative parity as the first parity to match.

9. The method of claim 8, further comprising detecting for errors in the decompressed data by performing operations comprising:
extracting a sequence of tokens comprising literals and references from the compressed stream;
determining a current position of an output byte stream comprising decompressed data;
for each literal, adding the literal to the current position in the output byte stream and advancing the current position by one;
for each reference,
determine if the reference is to be parity checked;
when the reference is not to be parity checked, adding the block of characters corresponding to the reference to the output stream and advancing the current position by the length of the block;
when the reference is to be parity checked,
determining a first parity match value comprising a cumulative parity of the output byte stream at the current position;
determining a second parity match value as a function of the length and distance for the reference; and
when the first and second parity match values do not match, generating an error; otherwise,
when the first and second parity match values match, adding the block of characters corresponding to the reference to the output stream, and advancing the current position by the length of the block.

10. The method of claim 9, further comprising:
at the first computing device or system, encoding every $N^{th}$ reference with a parity bit, where N is an integer greater than 0;
at the second computing device or system,
maintaining a count of references that have been processed;
based on the count of references, determine if a reference is an $N^{th}$ reference; and
when the reference is an $N^{th}$ reference, performing the parity check; otherwise,
when the reference is not an $N^{th}$ reference, adding the block of characters corresponding to the reference to the output stream without performing a parity check, and advancing the current position by the length of the block.

11. The method of claim 9, further comprising:
at the first computing device or system, employing a minimum distance between references encoded with hidden parity information;
at the second computing device or system,
determine if a reference is to be parity checked by determining whether a distance between a current reference and a last reference for which a parity check was performed is greater or equal to the minimum distance.

12. A system comprising:
a first computing device or system including,
a first processor;
first memory; and
at least one of a first network interface and a first fabric interface;
a second computing device or system including,
a second processor;
second memory; and
at least one of a second network interface and a second fabric interface;
wherein the first computing device or system is configured to,
encode a byte stream to generate a plurality of tokens;
encode at least a portion of the plurality of tokens with hidden parity information;
generate, using the plurality of tokens, a compressed byte stream;
wherein the second computing device or system is configured to,
receive the compressed byte stream and decompress the compressed byte stream to produce decompressed data; and
as the compressed byte stream is being decompressed, decode the hidden parity information encoded in the at least a portion of the plurality of tokens and use the parity information that is decoded to detect for errors in the decompressed data.

13. The system of claim 12,
wherein the first computing device or system is configured to,
encode the byte stream using a Lempel-Ziv 77 (LZ77)-based encoding process to generate a sequence of tokens comprising the plurality of tokens including a plurality of literals and a plurality of references, each reference identifying a length of a block of characters in the byte stream that match an earlier instance of the block of characters in the byte stream and a distance to the earlier instance of the block of characters; and
encode at least a portion of the references with hidden parity information;
and wherein the second computing device or system is configured to,
as the compressed byte stream is being decompressed, decoding the hidden parity information encoded in the at least a portion of the references and use the parity information that is decoded to detect for errors in the decompressed data.

14. The system of claim 13, wherein the compressed byte stream has a format compliant with a Deflate format and is configured to be decoded by a standard Deflate decoder without decoding the hidden parity information.

15. The system of claim 13, wherein the compressed byte stream has a format compliant with a Zstandard format and is configured to be decoded by a standard Zstandard decoder without decoding the hidden parity information.

16. The system of claim 13, wherein the first computing device or system is configured to:
   determine a first parity value to be matched;
   identify, beginning at a current position in the byte stream, a block of characters having a first length and matching a first prior block of characters in the byte stream at a first distance;
   determine a second parity value to be matched as a function of the first length and first distance;
   when the first and second parity values match, generate a reference with the first length and the first distance; otherwise,
   when the first and second parity values do not match, identify a second matching block of characters in the byte stream having one of the first length or a second length and at a second distance;
   determine a third parity value to be matched as a function of the first length and the second distance or the second length and the second distance; and
   when the first and third parity values match, generate a reference with the first length and second distance or the second length and the second distance.

17. The system of claim 16, wherein the first computing device or system is further configured to:
   when the first and second parity values do not match,
      decrement the first length by 1 to produce a second length;
      identify a second prior matching block of characters in the byte stream having the second length and being located at a second distance;
      determine the third parity value as a function of the second length and the second distance; and
      when the first and third parity values match, generate a reference with the second length and the second distance.

18. The system of claim 16, wherein the first computing device or system is further configured to:
   when the first and second parity values do not match,
      identify a second prior matching block of characters in the byte stream having the first length and being located at a second distance;
      determine the third parity value as a function of the first length and the second distance; and
      when the first and third parity values match, generate a reference with the first length and the second distance; otherwise
      when the first and third parity values do not match,
         identify a third prior matching block of characters in the byte stream having the first length and being located at a third distance;
         determine a fourth parity value as a function of the first length and the third distance; and
         when the first and fourth parity values match, generate a reference with the first length and the third distance.

19. The system of claim 18, wherein the first computing device or system is further configured to:
   determine a cumulative parity as a function of the current position in the byte stream; and
   use the cumulative parity as the first parity to match.

20. The system of claim 19, wherein the second computing device or system is further configured to:
   extract a sequence of tokens comprising literals and references from the compressed stream as it is received;
   determine a current position of an output byte stream comprising decompressed data;
   for each literal, add the literal at the current position in the output byte stream and advance the current position by one;
   for each reference,
      determine if the reference is to be parity checked;
      when the reference is not to be parity checked, add the block of characters corresponding to the reference to the output stream and advance the current position by the length of the block;
      when the reference is to be parity checked,
         determine a first parity match value comprising a cumulative parity of the output byte stream at the current position;
         determine a second parity match value as a function of the length and distance for the reference; and
         when the first and second parity match values do not match, generate an error; otherwise,
         when the first and second parity match values match, add the block of characters corresponding to the reference to the output stream, and advance the current position by the length of the block.

21. The system of claim 20, wherein the first computing device is further configured to encode every $N^{th}$ reference with a parity bit, where N is an integer greater than 0, and wherein the second computing device or system is further configured to:
   maintain a count of references that have been processed;
   based on the count of references, determine if a reference is an $N^{th}$ reference; and
   when the reference is an $N^{th}$ reference, perform the parity check; otherwise,
   when the reference is not an $N^{th}$ reference, add the block of characters corresponding to the reference to the output stream without performing a parity check, and advance the current position by the length of the block.

22. The system of claim 20, wherein the first computing device is further configured to employ a minimum distance between references encoded with hidden parity information, and wherein the second computing device or system is further configured to determine if a reference is to be parity checked by determining whether a distance between a current reference and a last reference for which a parity check was performed is greater or equal to the minimum distance.

23. The system of claim 12, wherein the first computing device is configured to encode the byte stream and generate the plurality of tokens by means of execution of a plurality of instructions on the first processor, the first plurality of instructions stored in at least one of the first memory and a storage device,
   and wherein the second computing device is configured decompress the compressed byte stream, decode the hidden parity information encoded in the at least a portion of the tokens, and use the parity information that is decoded to detect for errors in the decompressed data by means of execution of a second plurality of instructions on the second processor, the second plurality of instructions stored in at least one of the second memory and a storage device.

24. A non-transitory machine-readable medium have first and second sets of instructions stored thereon respectively configured to be executed on first and second computing devices or systems, wherein execution of the first set of instructions enables the first computing device or system to,
- encode a byte stream using a Lempel-Ziv 77 (LZ77)-based encoding process to generate a sequence of tokens including a plurality of literals and a plurality of references, each reference identifying a length of a block of characters in the byte stream that match an earlier instance of the block of characters in the byte stream and a distance to the earlier instance of the block of characters, at least a portion of the references encoded with parity information;
- generate, using the sequence of tokens, a compressed byte stream, and wherein execution of the second set of instructions enables the second computing device or system to,
- decompress a received compressed byte stream to produce decompressed data; and
- as the compressed byte stream is being decompressed, decode parity information encoded in at least a portion of references in the compressed byte stream and use the parity information to detect for errors in the decompressed data.

25. The non-transitory machine-readable medium of claim 24, wherein the first set of instructions include instructions for implementing a Huffman encoder, the second set of instruction including instructions for implementing a Huffman decoder, and the compressed byte stream has a format compliant with a Deflate format.

26. The non-transitory machine-readable medium of claim 24, wherein the first set of instructions include instructions for implementing a finite state entropy encoder, the second set of instruction including instructions for implementing a finite state entropy decoder, and the compressed byte stream has a format compliant with a Zstandard format.

27. The non-transitory machine-readable medium of claim 24, wherein the first set of instructions include instructions for implementing a Huff0 encoder, the second set of instruction including instructions for implementing a Huff0 decoder, and the compressed byte stream has a format compliant with a Zstandard format.

28. The non-transitory machine-readable medium of claim 24, wherein the first set of instructions further enable, upon execution, the first computing device or system to:
- determine a first parity value to be matched;
- identify, beginning at a current position in the byte stream, a block of characters having a first length and matching a first prior block of characters in the byte stream at a first distance;
- determine a second parity value to be matched as a function of the first length and first distance;
- when the first and second parity values match, generate a reference with the first length and the first distance; otherwise,
- when the first and second parity values do not match, identify a second matching block of characters in the byte stream having one of the first length or a second length and at a second distance;
- determine a third parity value to be matched as a function of the first length and the second distance or the second length and the second distance; and
- when the first and third parity values match, generate a reference with the first length and second distance or the second length and the second distance.

29. The non-transitory machine-readable medium of claim 28, wherein the first set of instructions further enable, upon execution, the first computing device or system to:
- when the first and second parity values do not match,
  - decrement the first length by 1 to produce a second length;
  - identify a second prior matching block of characters in the byte stream having the second length and being located at a second distance;
  - determine the third parity value as a function of the second length and the second distance; and
  - when the first and third parity values match, generate a reference with the second length and the second distance.

30. The non-transitory machine-readable medium of claim 28, wherein the first set of instructions further enable, upon execution, the first computing device or system to:
- when the first and second parity values do not match,
  - identify a second prior matching block of characters in the byte stream having the first length and being located at a second distance;
  - determine the third parity value as a function of the first length and the second distance; and
  - when the first and third parity values match, generate a reference with the first length and the second distance; otherwise
  - when the first and third parity values do not match,
    - identify a third prior matching block of characters in the byte stream having the first length and being located at a third distance;
    - determine a fourth parity value as a function of the first length and the third distance; and
    - when the first and fourth parity values match, generate a reference with the first length and the third distance.

* * * * *